(12) United States Patent
Bae et al.

(10) Patent No.: US 12,191,291 B2
(45) Date of Patent: Jan. 7, 2025

(54) DISPLAY DEVICE AND MANUFACTURING METHOD THEREOF

(71) Applicant: Samsung Display Co., Ltd., Yongin-si (KR)

(72) Inventors: Kwang Soo Bae, Yongin-si (KR); Beom Soo Park, Yongin-si (KR); Min Jeong Oh, Yongin-si (KR); Hae Ju Yun, Yongin-si (KR)

(73) Assignee: SAMSUNG DISPLAY CO., LTD. (KR)

(*) Notice: Subject to any disclaimer, the term of this patent is extended or adjusted under 35 U.S.C. 154(b) by 818 days.

(21) Appl. No.: 17/223,721

(22) Filed: Apr. 6, 2021

(65) Prior Publication Data

US 2021/0327862 A1 Oct. 21, 2021

(30) Foreign Application Priority Data

Apr. 20, 2020 (KR) .................. 10-2020-0047627

(51) Int. Cl.

| H01L 25/16 | (2023.01) |
|---|---|
| G02F 1/1333 | (2006.01) |
| G02F 1/1335 | (2006.01) |
| H01L 25/075 | (2006.01) |
| H01L 33/50 | (2010.01) |
| H01L 33/54 | (2010.01) |
| H01L 33/60 | (2010.01) |
| H10K 59/121 | (2023.01) |
| H10K 59/123 | (2023.01) |
| H10K 59/131 | (2023.01) |
| H10K 59/38 | (2023.01) |

(52) U.S. Cl.
CPC ............ *H01L 25/167* (2013.01); *H01L 33/54* (2013.01); *H01L 33/507* (2013.01); *H01L 33/60* (2013.01); *H01L 2933/0041* (2013.01); *H01L 2933/005* (2013.01)

(58) Field of Classification Search
CPC .............. H01L 25/167; H01L 25/0753; H10K 59/1213; H10K 59/123; H10K 59/122
See application file for complete search history.

(56) References Cited

U.S. PATENT DOCUMENTS

| 10,340,419 B2 | 7/2019 | Kim et al. | |
|---|---|---|---|
| 2019/0198802 A1* | 6/2019 | Lee | H10K 59/1213 |
| 2020/0013766 A1* | 1/2020 | Kim | H01L 25/167 |

FOREIGN PATENT DOCUMENTS

| KR | 10-2020-0005692 A | | 1/2020 |
|---|---|---|---|
| KR | 10-2020-0013824 A | | 2/2020 |
| KR | 2020-0013824 A | * | 10/2020 |

* cited by examiner

*Primary Examiner* — Antonio B Crite

(74) *Attorney, Agent, or Firm* — Lewis Roca Rothgerber Christie LLP

(57) ABSTRACT

A display device and a manufacturing method thereof are provided. The display device includes a display substrate, sub-pixels on the display substrate, each of the sub-pixels including a first electrode and a second electrode on the display substrate and spaced apart from each other, light emitting elements between the first electrode and the second electrode, an insulating layer covering the light emitting elements, a protective pattern on the insulating layer and overlapping one of the light emitting elements, and a bank on the insulating layer at a boundary of one of the sub-pixels.

20 Claims, 19 Drawing Sheets

DISPLAY DEVICE AND MANUFACTURING METHOD THEREOF

CROSS-REFERENCE TO RELATED APPLICATION

This application claims priority to, and the benefit of, Korean Patent Application No. 10-2020-0047627 filed in the Korean Intellectual Property Office on Apr. 20, 2020, the entire contents of which are incorporated herein by reference.

BACKGROUND

1. Field

The present disclosure relates to a display device and a manufacturing method thereof.

2. Description of the Related Art

Recently, as interest in display devices has increased, research and development on display devices has been continuously conducted.

SUMMARY

The present disclosure provides a display device with improved element reliability and light efficiency, and a manufacturing method thereof.

The objects of the present disclosure are not limited to the object mentioned above, and other technical objects that are not mentioned may be clearly understood to a person of an ordinary skill in the art using the following description.

Some embodiments of the present disclosure provide a display device including a display substrate, sub-pixels on the display substrate, each of the sub-pixels including a first electrode and a second electrode on the display substrate and spaced apart from each other, light emitting elements between the first electrode and the second electrode, an insulating layer covering the light emitting elements, a protective pattern on the insulating layer and overlapping one of the light emitting elements, and a bank on the insulating layer at a boundary of one of the sub-pixels.

The display device may further include a color control layer on the insulating layer.

The color control layer may directly cover the protective pattern.

The color control layer may cover ends of the light emitting element.

The color control layer may include a base resin, and quantum dots dispersed in the base resin.

The display device may further include a reflective layer on a surface of the bank.

The display device may further include a capping layer on the color control layer.

A refractive index of the protective pattern may be smaller than a refractive index of the color control layer.

The protective pattern may cover upper and side surfaces of the light emitting element.

The protective pattern and the bank may be directly on the insulating layer.

The protective pattern and the bank may include the same material.

The protective pattern and the bank may include an organic insulating material.

A distance between respective ends of the protective pattern may be less than a distance between one end of the protective pattern and one end of the bank.

A thickness of the protective pattern may be less than a thickness of the bank.

The sub-pixels may include a first sub-pixel, a second sub-pixel, and a third sub-pixel, wherein the bank is at boundaries of the first sub-pixel, the second sub-pixel, and the third sub-pixel.

The light emitting elements may include first light emitting elements in the first sub-pixel, second light emitting elements in the second sub-pixel, and third light emitting elements in the third sub-pixel, and wherein the first to third light emitting elements emit light of the same color.

The display device may further include a first wavelength converting layer in the first sub-pixel, a second wavelength converting layer in the second sub-pixel, and a light transmitting layer in the third sub-pixel.

The display device may further include a color filter directly on the capping layer.

The display device may further include a color filter substrate on the display substrate, a color filter on a surface of the color filter substrate, and a filling layer between the color filter and the color control layer.

Other embodiments of the present disclosure provides a manufacturing method of a display device, the method including providing a first electrode and a second electrode on a substrate on which sub-pixels are defined, providing light emitting elements between the first electrode and the second electrode, providing an insulating layer on the light emitting elements, providing a bank at a boundary of the sub-pixels on the insulating layer, and providing a protective pattern on the insulating layer so as to overlap the light emitting elements, wherein the bank and the protective pattern are substantially simultaneously formed.

The providing of the bank and the providing of the protective pattern may include providing an organic layer on the insulating layer, and patterning the organic layer to form the bank and the protective pattern.

The method may further include forming a color control layer in a space surrounded by the bank and the protective pattern.

According to some embodiments, because the first and second electrodes are flat, an insulating layer may be easily formed on the upper portions of the first and second electrodes, thereby securing element reliability. In addition, as the color control layer is located on one side and the other side of the light emitting element, light emitted from one end and the other end of the light emitting element may be directly provided into the color control layer along a horizontal direction. That is, because an amount of light lost due to reflection may be reduced or minimized, light efficiency of a display device may be improved. Further, because a separate color control layer or color control substrate located on the upper portion of the light emitting element may be omitted, a thin display device may be implemented.

The embodiments of the present disclosure are not limited by what is illustrated in the above, and more various effects are included in the present specification.

DETAILED DESCRIPTION

Figure 1:
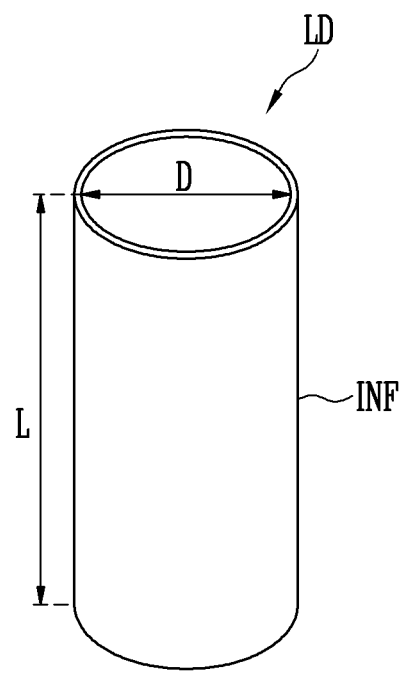
FIG. 1 and FIG. 2 illustrates a perspective view and a cross-sectional view of a light emitting element according to some embodiments, respectively.

Features of the inventive concept and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments will be described in detail with reference to the accompanying the drawings.

Figure 2:
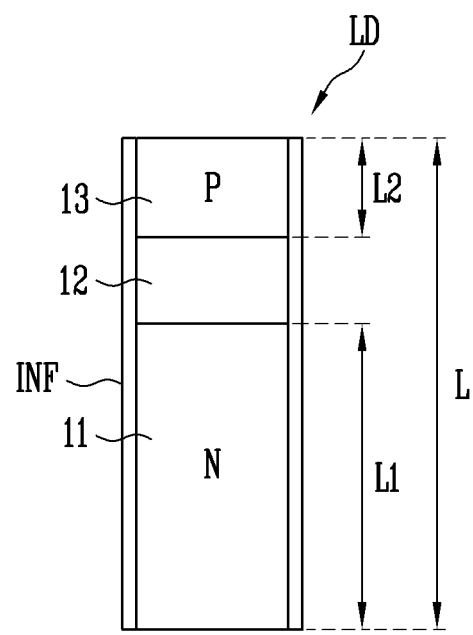

FIG. 1 and FIG. 2 illustrates a perspective view and a cross-sectional view of a light emitting element according to some embodiments, respectively. In FIG. 1 and FIG. 2, a cylindrical rod-shaped light emitting element LD is illustrated, but a type and/or shape of the light emitting element LD is not limited thereto.

Referring to FIG. 1 and FIG. 2, the light emitting element LD may include a first semiconductor layer 11, a second semiconductor layer 13, and an active layer 12 interposed between the first and second semiconductor layers 11 and 13. For example, the light emitting element LD may be configured as a stacked body in which the first semiconductor layer 11, the active layer 12, and the second semiconductor layer 13 are sequentially stacked along one direction.

According to some embodiments, the light emitting element LD may be provided to have a rod shape extending along one direction. The light emitting element LD may have one end portion and the other end portion along one direction.

According to some embodiments, one of the first and second semiconductor layers 11 and 13 is located at one end portion of the light emitting element LD, and the other of the first and second semiconductor layers 11 and 13 are located at the other end portion of the light emitting element LD.

According to some embodiments, the light emitting element LD may be a rod-shaped light emitting diode manufactured in a rod shape. Here, the rod shape includes a rod-like shape or a bar-like shape, of which a longitudinal direction is longer than a width direction thereof, such as a cylinder or polygonal column, and a shape of a cross section thereof is not particularly limited. For example, a length L of the light emitting element LD may be greater than a diameter D thereof (or a width of a cross section thereof).

According to some embodiments, the light emitting element LD has a size as small as a nanometer scale to a micrometer scale, for example, a diameter D and/or a length L ranging from about 100 nm to about 10 um. However, the size of the light emitting element LD is not limited thereto. For example, the size of the light emitting element LD may be variously changed according to design conditions of various devices using a light emitting device using the light emitting element LD as a light source, for example, a display device.

The first semiconductor layer 11 may include at least one n-type semiconductor material. For example, the first semiconductor layer 11 may include one semiconductor material of InAlGaN, GaN, AlGaN, InGaN, AlN, and InN, and it may include an n-type semiconductor material doped with a first conductive dopant such as Si, Ge, and Sn, but is not necessarily limited thereto.

The active layer 12 is located on the first semiconductor layer 11, and may be formed to have a single or multiple quantum well structure. A clad layer doped with a conductive dopant may be formed in an upper portion and/or a lower portion of the active layer 12. For example, the clad layer may be formed as an AlGaN layer or an InAlGaN layer. According to some embodiments, a material such as AlGaN and AlInGaN may be used to form the active layer 12, and in addition, various materials may form the active layer 12. The active layer 12 may be located between the first semiconductor layer 11 and the second semiconductor layer 13 described later.

When a voltage of a threshold voltage or more is applied to both ends of the light emitting element LD, the light emitting element LD emits light while electron-hole pairs are combined in the active layer 12. By controlling the light emission of the light emitting element LD by using this principle, the light emitting element LD may be used as a light source for various light emitting devices in addition to pixels of a display device.

The second semiconductor layer 13 is located on the active layer 12, and may include a semiconductor material of a type different from that of the first semiconductor layer 11. For example, the second semiconductor layer 13 may include at least one p-type semiconductor material. For example, the second semiconductor layer 13 may include at least one semiconductor material of InAlGaN, GaN, AlGaN, InGaN, AlN, and InN, and may include a p-type semiconductor material doped with a second conductive dopant such as Mg. However, the material included in the second semiconductor layer 13 is not limited thereto, and the second semiconductor layer 13 may be formed of various materials.

According to some embodiments, a first length L1 of the first semiconductor layer 11 may be longer than a second length L2 of the second semiconductor layer 13.

According to some embodiments, the light emitting element LD may further include an insulating film INF provided on a surface thereof. The insulating film INF may be formed on the surface of the light emitting element LD so as to surround at least an outer circumferential surface of the active layer 12, and may further surround one region of the first and second semiconductor layers 11 and 13.

However, according to some embodiments, the insulating film INF may expose both end portions of the light emitting element LD having different polarities. For example, the insulating film INF does not cover one end (for example, two planes of a cylinder, or upper and lower surfaces) of each of the first and second semiconductor layers 11 and 13 located at both ends of the light emitting element LD in a longitudinal direction, but may expose it. In some embodiments, the insulating film INF may expose both end portions of the light emitting element LD having different polarities and side portions of the semiconductor layers 11 and 13 adjacent to the both end portions.

According to some embodiments, the insulating film INF may include at least one insulating material of a silicon dioxide ($SiO_2$), a silicon nitride ($Si_3N_4$), an aluminum oxide ($Al_2O_3$), and a titanium dioxide ($TiO_2$), but is not limited thereto.

The light emitting element LD may further include an additional component in addition to the first semiconductor layer 11, the active layer 12, the second semiconductor layer 13 and/or the insulating film INF. For example, the light emitting element LD may additionally include one or more of a phosphor layer, an active layer, a semiconductor material, and/or an electrode layer located on one side of the first semiconductor layer 11, the active layer 12, and/or the second semiconductor layer 13.

Figure 3:
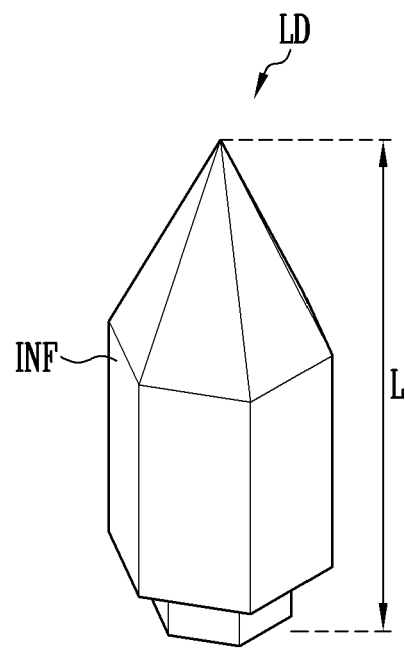
FIG. 3 and FIG. 4 illustrates a perspective view and a cross-sectional view of a light emitting element according to other embodiments, respectively.
Figure 4:
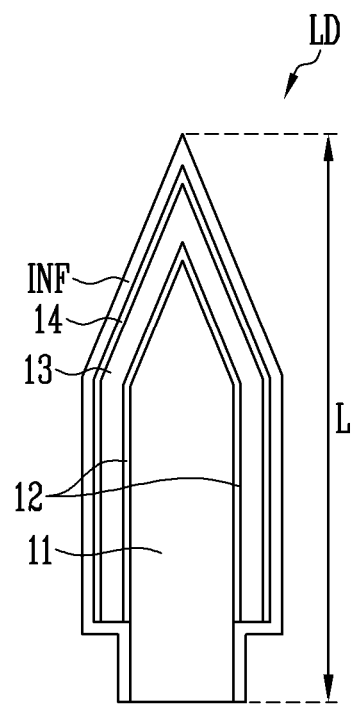

FIG. 3 and FIG. 4 illustrates a perspective view and a cross-sectional view of a light emitting element according to other embodiments, respectively.

Referring to FIG. 3 and FIG. 4, a light emitting element LD according to some embodiments may include a first semiconductor layer 11, a second semiconductor layer 13, and an active layer 12 interposed between the first and second semiconductor layers 11 and 13. According to some embodiments, the first semiconductor layer 11 is located in a central region of the light emitting element LD, and the active layer 12 may be located on a surface of the first semiconductor layer 11 to surround or partially surround at least one region of the first semiconductor layer 11. In addition, the second semiconductor layer 13 may be located on a surface of the active layer 12 to surround or partially surround at least one region of the active layer 12.

Further, the light emitting element LD may further include an electrode layer 14 and/or an insulating film INF surrounding or partially surrounding at least one region of the second semiconductor layer 13. For example, the light emitting element LD may include the electrode layer 14 located on a surface of the second semiconductor layer 13 so as to surround or partially surround one region of the second semiconductor layer 13, and the insulating film INF located on a surface of the electrode layer 14 so as to surround or partially surround at least one region of the electrode layer 14. That is, the light emitting element LD according to the above-described example may be implemented to have a core-shell structure including the first semiconductor layer 11, the active layer 12, the second semiconductor layer 13, the electrode layer 14, and the insulating film INF sequentially located from a center to an outer side, and the electrode layer 14 and/or insulating film INF may be omitted in some embodiments.

The light emitting element LD may be provided in a polygonal horn shape extending along one direction. For example, at least one region of the light emitting element LD may have a hexagonal horn shape. However, the shape of the light emitting element LD is not limited thereto, and may be variously changed.

When an extending direction of the light emitting element LD is referred to as a length L direction, the light emitting element LD may be provided with one end portion and the other end portion along the length L direction. According to some embodiments, one of the first and second semiconductor layers 11 and 13 is located at one end portion of the light emitting element LD, and the other of the first and second semiconductor layers 11 and 13 are located at the other end portion of the light emitting element LD.

The light emitting element LD may be a polygonal columnar shape, for example, a micro-light emitting diode having a core-shell structure made of a hexagonal horn shape with both end portions protruding. For example, the light emitting element LD may have a size as small as a nanometer scale to a micrometer scale, for example, a width and/or a length L of a nanometer scale or micrometer scale range. However, the size and/or shape of the light emitting element LD may be variously changed according to design conditions of various devices using the light emitting element LD as a light source, for example, a display device.

Both end portions of the first semiconductor layer 11 along the length L direction of the light emitting element LD may have protruding shapes. The protruding shapes of both end portions of the first semiconductor layer 11 may be different from each other. For example, one end portion located at an upper side of the first semiconductor layer 11 may have a horn shape contacting one vertex as a width thereof narrows toward an upper portion. In addition, the other end portion located at a lower side of both end portions of the first semiconductor layer 11 may have a polygonal column shape having a constant width, but is not limited thereto. For example, in other embodiments, the first semiconductor layer 11 may have a cross section of a polygonal shape or a step shape, which gradually decreases in width as it goes downward. The shapes of both end portions of the first semiconductor layer 11 may be variously changed according to embodiments, and thus, are not limited to the above-described embodiment.

According to some embodiments, the first semiconductor layer 11 may be located at a core of the light emitting element LD, that is, at a center (or central region).

In addition, the light emitting element LD may be provided to have a shape corresponding to a shape of the first semiconductor layer 11. For example, when the first semiconductor layer 11 has a hexagonal horn shape, the light emitting element LD may have a hexagonal horn shape.

Figure 5:
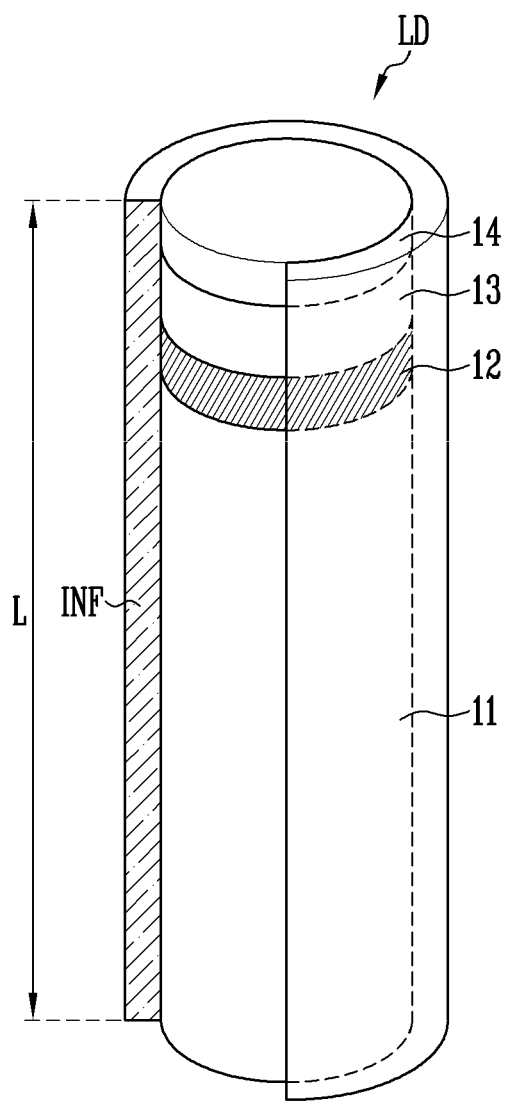
FIG. 5 illustrates a perspective view of a light emitting element according to other embodiments.

FIG. 5 illustrates a perspective view of a light emitting element according to other embodiments. In FIG. 5, a portion of the insulating film INF is omitted for convenience of description.

Referring to FIG. 5, the light emitting element LD may further include the electrode layer 14 located on the second semiconductor layer 13.

The electrode layer 14 may be an ohmic contact electrode electrically connected to the second semiconductor layer 13, but is not limited thereto. In some embodiments, the electrode layer 14 may be a Schottky contact electrode. The electrode layer 14 may include a metal or a metal oxide, and for example, Cr, Ti, Al, Au, Ni, ITO, IZO, ITZO, and an oxide thereof or an alloys thereof may be used alone or in combination therein. In addition, the electrode layer 14 may be substantially transparent or transflective. Accordingly, light generated by the active layer 12 of the light emitting element LD may transmit through the electrode layer 14 and may be emitted to the outside of the light emitting element LD.

In other embodiments, the light emitting element LD may include an electrode layer 14 located on the second semiconductor layer 13, and may further include an electrode layer located on the first semiconductor layer 11.

Figure 6:
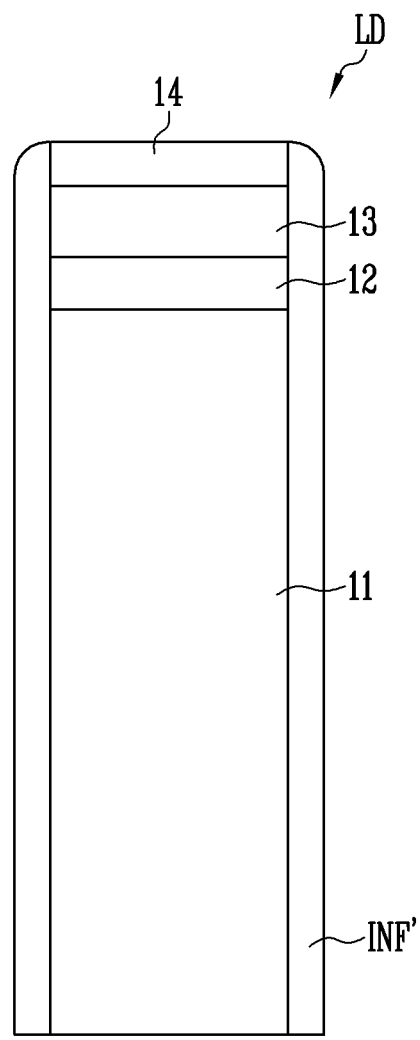
FIG. 6 illustrates a cross-sectional view of a light emitting element according to other embodiments.

FIG. 6 illustrates a cross-sectional view of a light emitting element according to other embodiments.

Referring to FIG. 6, an insulating film INF' may have a curved shape in a corner region adjacent to the electrode layer 14. According to some embodiments, when the light emitting element LD is manufactured, the curved shape may be formed due to etching.

In some embodiments, even in a light emitting element having the structure that further includes the electrode layer located on the first semiconductor layer 11, the insulating film INF' may have a curved shape in a region adjacent to the electrode layer.

Figure 7:
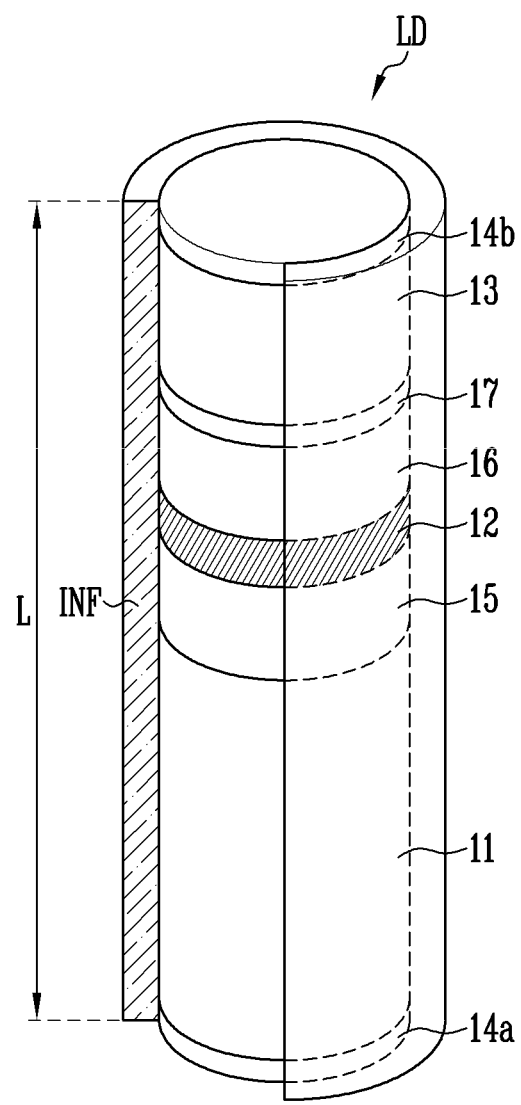
FIG. 7 illustrates a perspective view of a light emitting element according to other embodiments.

FIG. 7 illustrates a perspective view of a light emitting element according to other embodiments. In FIG. 7, a portion of the insulating film INF is omitted for convenience of description.

First, referring to FIG. 7, the light emitting element LD according to some embodiments may further include a third semiconductor layer 15 located between the first semiconductor layer 11 and the active layer 12, and a fourth semiconductor layer 16 and a fifth semiconductor layer 17 located between the active layer 12 and the second semiconductor layer 13. The light emitting element LD of FIG. 7 is different from that of the embodiments of FIG. 1 in that a plurality of semiconductor layers 15, 16, and 17 and electrode layers 14a and 14b are further located, and the active layer 12 contains other elements. Other than the depiction of the arrangement and structure of the insulating film INF, the example shown in FIG. 7 is substantially the same as that of FIG. 1. In FIG. 7, some of the members are the same as those of FIG. 1, but new reference numerals are denoted for convenience of description. Hereinafter, redundant descriptions will be omitted, and differences from the above-described example will be mainly described.

As described above, in the light emitting element LD of FIG. 1, the active layer 12 may include nitrogen (N) to emit blue or green light. Meanwhile, in the light emitting element LD of FIG. 7, the active layer 12 and other semiconductor layers may be a semiconductor including at least phosphorus (P), respectively. That is, the light emitting element LD according to some embodiments may emit red light having a center wavelength band of about 620 nm to about 750 nm. However, it should be understood that the central wavelength band of red light is not limited to the above-described range, and includes all wavelength ranges that may be recognized as red in the art.

For example, in the light emitting element LD according to some embodiments of FIG. 7, the first semiconductor layer 11 is an n-type semiconductor layer, and when the light emitting element LD emits red light, the first semiconductor layer 11 may include a semiconductor material having the formula $In_xAl_yGa1-x-yP$ ($0 \le x \le 1$, $0 \le y \le 1$, $0 \le x+y \le 1$). For example, the first semiconductor layer 11 may be any one or more of n-type doped InAlGaP, GaP, AlGaP, InGaP, AlP, and InP. The first semiconductor layer 11 may be doped with an n-type dopant, and for example, the n-type dopant may be Si, Ge, Sn, or the like. The first semiconductor layer 11 may be n-AlGaInP doped with n-type Si. A length of the first semiconductor layer 11 may be about 1.5 um to about 5 um, but is not limited thereto.

The second semiconductor layer 13 is a p-type semiconductor layer, and when the light emitting element LD emits red light, the second semiconductor layer 13 may include a semiconductor material having the formula $In_xAl_yGa1-x-yP$ ($0 \le x \le 1$, $0 \le y \le 1$, $0 \le x+y \le 1$). For example, the second semiconductor layer 13 may be any one or more of p-type doped InAlGaP, GaP, AlGaNP, InGaP, AlP, and InP. The second semiconductor layer 13 may be doped with a p-type dopant, and for example, the p-type dopant may be Mg, Zn, Ca, Se, Ba, or the like. The second semiconductor layer 13 may be p-GaP doped with p-type Mg. A length of the second semiconductor layer about 0.08 um to about 0.25 um, but is not limited thereto.

The active layer 12 may be located between the first semiconductor layer 11 and the second semiconductor layer 13. As in the active layer 12 of FIG. 1, the active layer 12 of FIG. 7 may also emit light of a given (e.g., specific) wavelength band by including a material having a single or multiple quantum well structure. For example, when the active layer 12 emits light in a red wavelength band, the active layer 12 may include a material such as AlGaP or AlInGaP. Particularly, when the active layer 12 has a structure in which a quantum layer and a well layer are alternately stacked in a multi-quantum well structure, the quantum layer may include a material such as AlGaP or AlInGaP, and the well layer may include a material such as GaP or AlInP. The active layer 12 may emit red light having a central wavelength band of about 620 nm to about 750 nm by including AlGaInP as the quantum layer and AlInP as the well layer.

The light emitting element LD of FIG. 7 may include a clad layer located adjacent to the active layer 12. As shown in the drawing, the third semiconductor layer 15 and the fourth semiconductor layer 16 located between the first semiconductor layer 11 and the second semiconductor layer 13 above and below the active layer 12 may be clad layers.

The third semiconductor layer 15 may be located between the first semiconductor layer 11 and the active layer 12. The third semiconductor layer 15 may be an n-type semiconductor like the first semiconductor layer 11, and for example, the third semiconductor layer 15 may include a semiconductor material having the formula $In_xAl_yGa1-x-yP$ ($0 \le x \le 1$, $0 \le y \le 1$, $0 \le x+y \le 1$). The first semiconductor layer 11 may be n-AlGaInP, and the third semiconductor layer 15 may be n-AlInP. However, it is not limited thereto.

The fourth semiconductor layer 16 may be located between the active layer 12 and the second semiconductor layer 13. The fourth semiconductor layer 16 may be an n-type semiconductor like the second semiconductor layer 13, and for example, the fourth semiconductor layer 16 may include a semiconductor material having the formula $In_xAl_yGa1-x-yP$ ($0 \le x \le 1$, $0 \le y \le 1$, $0 \le x \le 1$). The second semiconductor layer 13 may be p-GaP, and the fourth semiconductor layer 16 may be p-AlInP.

The fifth semiconductor layer 17 may be located between the fourth semiconductor layer 16 and the second semiconductor layer 13. The fifth semiconductor layer 17 may be a p-type doped semiconductor like the second semiconductor layer 13 and the fourth semiconductor layer 16. In some embodiments, the fifth semiconductor layer 17 may function to reduce a difference in lattice constant between the fourth semiconductor layer 16 and the second semiconductor layer 13. That is, the fifth semiconductor layer 17 may be a tensile strain barrier reducing (TSBR) layer. For example, the fifth semiconductor layer 17 may include p-GaInP, p-AlInP, or p-AlGaInP, but is not limited thereto. In addition, lengths of the third semiconductor layer 15, the fourth semiconductor layer 16, and the fifth semiconductor layer 17 may be about 0.08 um to about 0.25 um, but are not limited thereto.

The first electrode layer 14a and the second electrode layer 14b may be located on the first semiconductor layer 11 and the second semiconductor layer 13, respectively. The first electrode layer 14a may be located on a lower surface of the first semiconductor layer 11, and the second electrode layer 14b may be located on an upper surface of the second semiconductor layer 13. However, the present disclosure is not limited thereto, and at least one of the first electrode layer 14a and the second electrode layer 14b may be omitted. For example, in the light emitting element LD, the first electrode layer 14a is not located on the lower surface of the first semiconductor layer 11, while only the second electrode layer 14b is located on the upper surface of the second semiconductor layer 13. The first electrode layer 14a and the second electrode layer 14b may each include at least one of the materials illustrated in the electrode layer 14 of FIG. 5.

The following embodiments will be described as an example to which the light emitting element LD shown in FIG. 1 and FIG. 2 is applied, but a person skilled in the art may apply, to the described embodiments, various types of light emitting elements including the light emitting element LD shown in FIG. 3 to FIG. 7.

Figure 8:
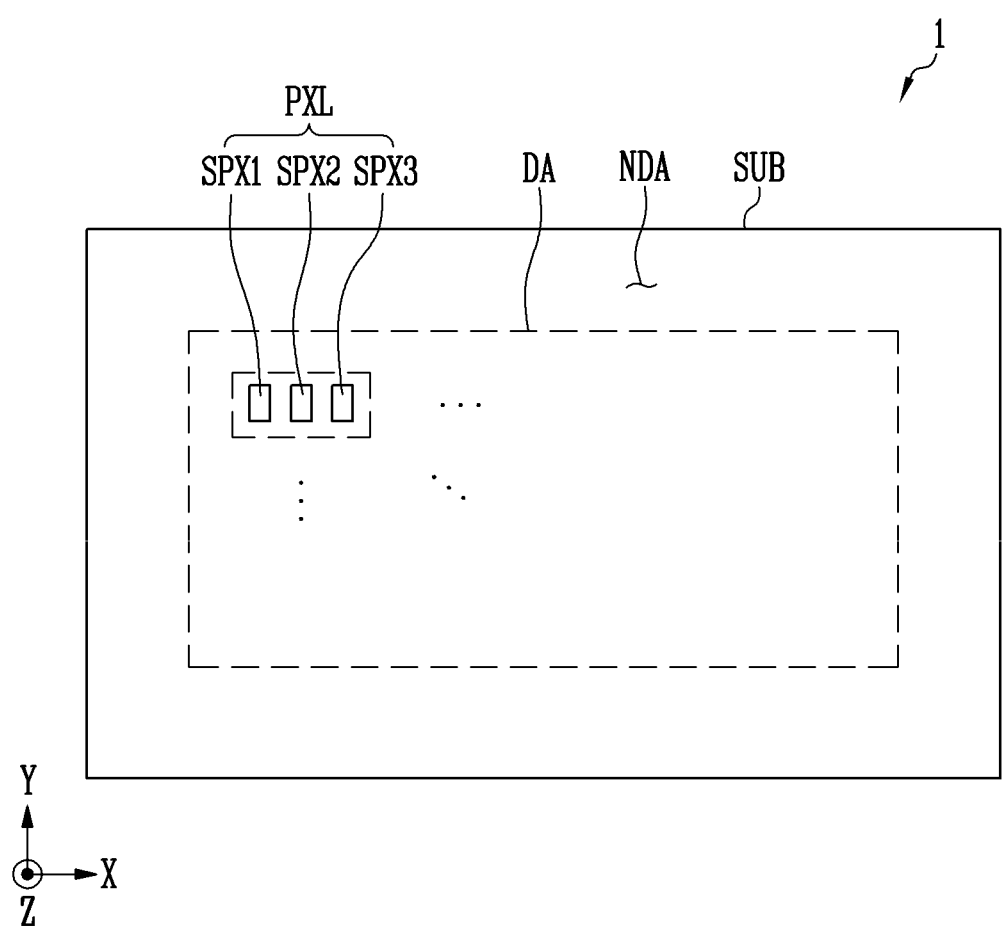
FIG. 8 illustrates a schematic view of a display device according to some embodiments.

FIG. 8 illustrates a schematic view of a display device according to some embodiments.

A display device 1 may be used as a display screen of portable electronic devices such as a mobile phone, a smart phone, a tablet personal computer (PC), a smart watch, a watch phone, a mobile communication terminal, an electronic notebook, an electronic book, a portable multimedia player (PMP), a navigation system, and an ultra-mobile PC (UMPC) as well as a display screen of various products such as a television set, a laptop computer, a monitor, a billboard, and Internet of Things.

The display device 1 may include a display substrate SUB and a plurality of pixels PXL defined on the display substrate SUB. The display substrate SUB may be a rigid substrate or a flexible substrate, and its material or physical properties are not particularly limited. For example, the display substrate SUB may be a rigid substrate made of glass or tempered glass, or a flexible substrate made of a thin film made of plastic or metal. In addition, the display substrate SUB may be a transparent substrate, but is not limited thereto. For example, the display substrate SUB may be a translucent substrate, an opaque substrate, or a reflective substrate.

The display device 1 and the display substrate SUB may include a display area DA for displaying a screen and a non-display area NDA not displaying. The non-display area NDA may be located to surround the display area DA, but is not limited thereto. The display area DA may include a plurality of pixels PXL. The pixels PXL may include at least one light emitting element LD driven by a scan signal and a data signal, for example, at least one light emitting diode according to one of the embodiments of FIG. 1 to FIG. 7. The plurality of light emitting diodes may configure a light source of the pixel PXL.

The pixels PXL may include a plurality of sub-pixels SPX1, SPX2, and SPX3. For example, the plurality of sub-pixels SPX1, SPX2, and SPX3 may include a first sub-pixel SPX1, a second sub-pixel SPX2, and a third sub-pixel SPX3. According to some embodiments, the first to third sub-pixels SPX1, SPX2, and SPX3 may emit light with different colors. For example, the first sub-pixel SPX1 may be a red sub-pixel emitting red, the second sub-pixel SPX2 may be a green sub-pixel emitting green, and the third sub-pixel SPX3 may be a blue sub-pixel emitting blue. However, the color, type, and/or number of the sub-pixels SPX1, SPX2, and SPX3 included in the pixel PXL are not particularly limited, and the color of light emitted by each of the sub-pixels SPX1, SPX2, and SPX3 may be variously changed. In addition, although FIG. 8 illustrates an example in which the sub-pixels SPX1, SPX2, and SPX3 are arranged in a stripe shape in the display area DA, the present disclosure is not limited thereto. For example, the pixels PXL may be arranged in various pixel arrangement types that are currently known.

Each of the sub-pixels SPX1, SPX2, and SPX3 is connected to a scan line and a data line, and may also be connected to a high potential power line and to a low potential power line. Each of the sub-pixels SPX1, SPX2, and SPX3 may emit light with luminance corresponding to the data signal transmitted through the data line in response to the scan signal transmitted through the scan line. The sub-pixels SPX1, SPX2, and SPX3 may include pixel structures or pixel circuits that are substantially the same as each other.

Figure 9:
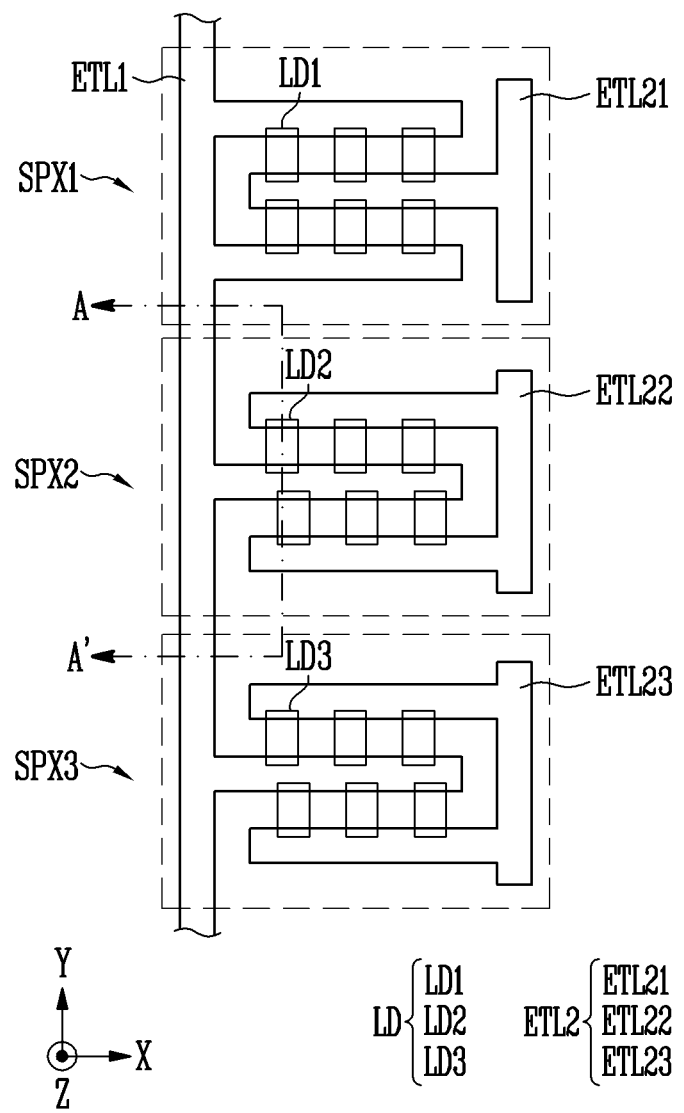
FIG. 9 illustrates a top plan view of arrangement of sub-pixels of FIG. 8.

FIG. 9 illustrates a top plan view of arrangement of sub-pixels of FIG. 8.

Referring to FIG. 9, each of the first to third sub-pixels SPX1, SPX2, and SPX3 may include a first electrode ETL1 and a second electrodes ETL2 spaced apart from each other, and at least one of first to third light emitting elements LD1, LD2, and LD3 connected between the first and second electrodes ETL1 and ETL2.

The first electrode ETL1 may be an electrode shared by the first to third sub-pixels SPX1, SPX2, and SPX3. In this case, the first to third sub-pixels SPX1, SPX2, and SPX3 may be arranged along a second direction (Y-axis direction).

The second electrodes ETL2 may be spaced apart from the first electrode ETL1 in a first direction (X-axis direction). Second electrodes ETL21, ETL22, and ETL23 in the first to third sub-pixels SPX1 to SPX3 may be arranged along the second direction (Y-axis direction).

The first and second electrodes ETL1 and ETL2 may be arranged side by side (e.g., to be parallel parallel), and may be spaced apart from each other by a given (e.g., predetermined) interval.

The first electrode ETL1 may be a cathode electrode electrically connected to a low potential power source. The second electrodes ETL2 may be an anode electrode electrically connected to a high potential power source. Light emitting elements LD having end portions electrically connected to the first electrode ETL1 and the second electrodes ETL2, respectively, are located, so that the first electrode ETL1 and each of the second electrodes ETL2 may be electrically connected.

The first to third light emitting elements LD1, LD2, and LD3 may emit light of the same color. For example, the first to third light emitting elements LD1, LD2, and LD3 may be all sub-pixels that emit light with one of red, green, or blue colors. In this case, to form a full-color pixel PXL, a color control layer and/or color filter for converting the color of light emitted from the first to third light emitting elements LD1, LD2, and LD3 may be located at the upper portions of the first to third light emitting elements LD1, LD2, and LD3. Detailed description of this will be described later with reference to FIG. 10. However, the present disclosure is not limited thereto, and the first to third light emitting elements LD1, LD2, and LD3 may emit light with different colors.

Figure 10:
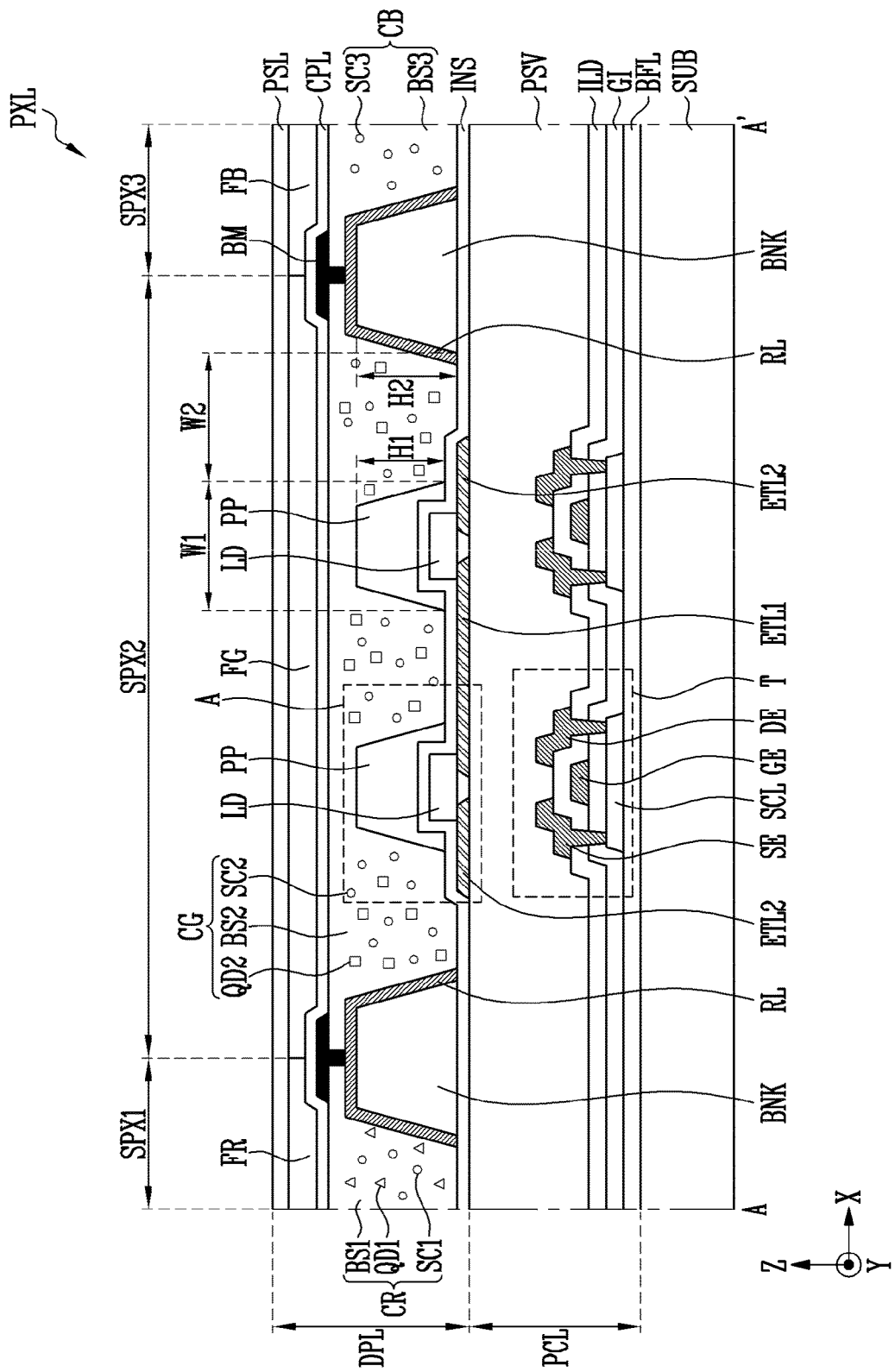
FIG. 10 illustrates a cross-sectional view taken along the line A-A' of FIG. 9.
Figure 11:
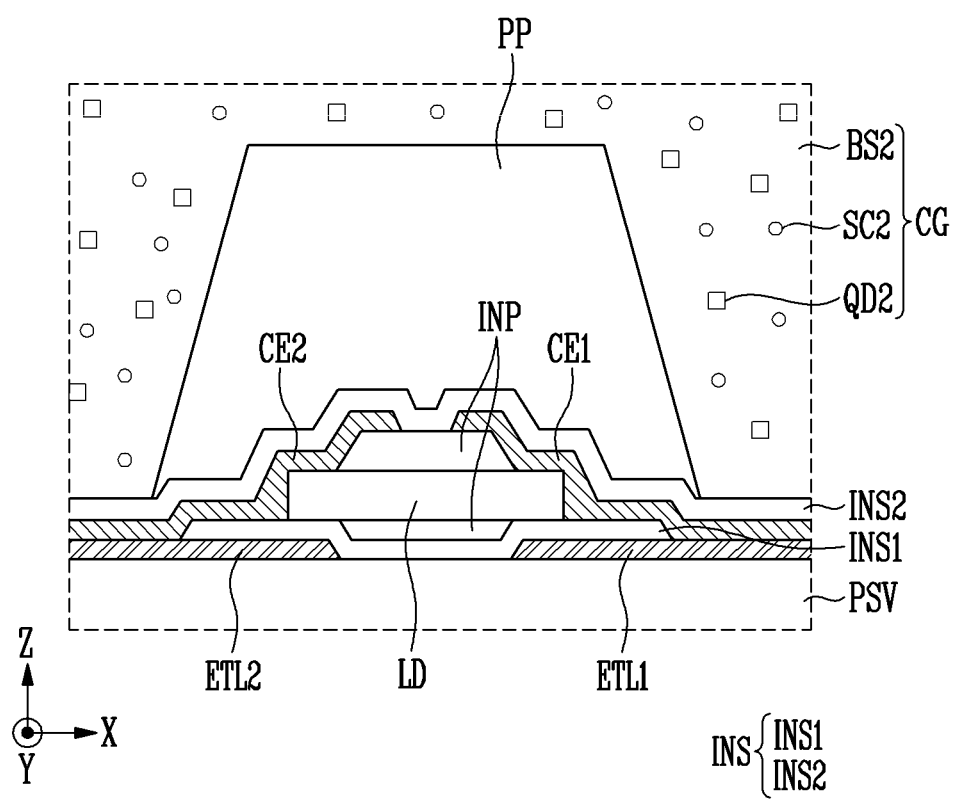
FIG. 11 and FIG. 12 illustrate enlarged cross-sectional views of the region A of FIG. 10.
Figure 12:
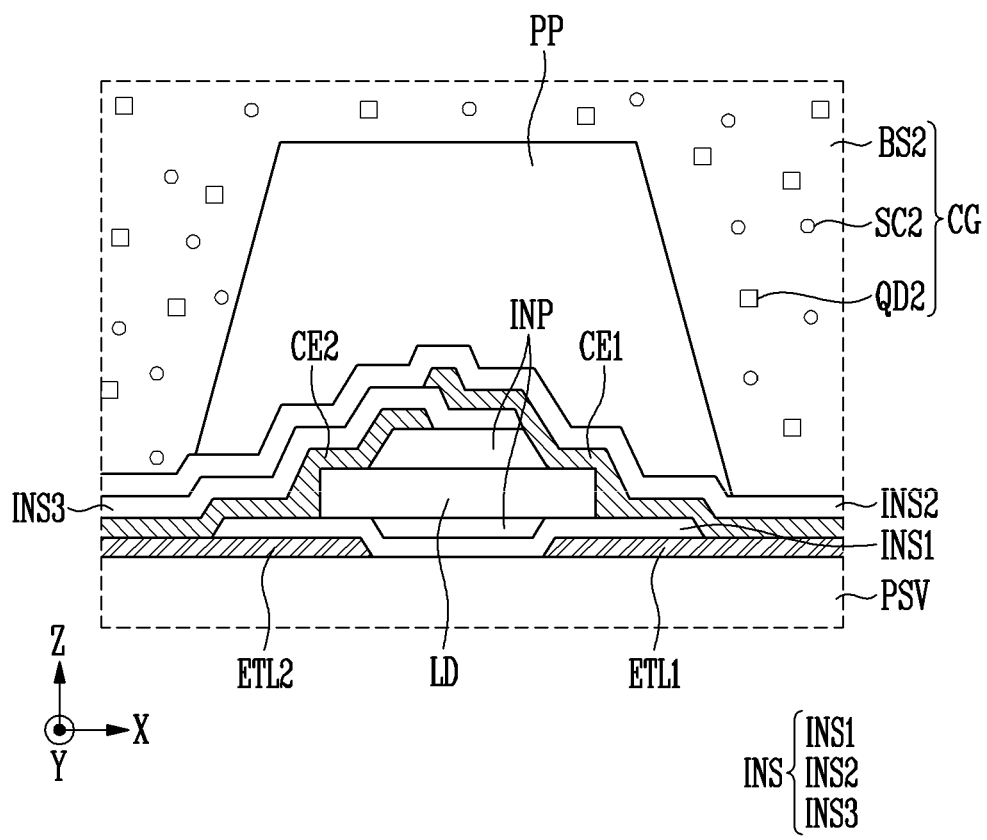

FIG. 10 illustrates a cross-sectional view taken along the line A-A' of FIG. 9. FIG. 11 and FIG. 12 illustrate enlarged cross-sectional views of the region A of FIG. 10.

Referring to FIG. 10, the pixels PXL and the display device 1 including the same, according to some embodiments, include a circuit element layer PCL and a display element layer DPL sequentially located on one surface of the display substrate SUB. Hereinafter, respective sub-pixels SPX1, SPX2, and SPX3 will be comprehensively described based on the second sub-pixel SPX2.

The circuit element layer PCL may include at least one circuit element electrically connected to the light emitting elements LD of each sub-pixel SPX1, SPX2, and SPX3. For example, the circuit element layer PCL may include a plurality of transistors T included in each pixel circuit.

For convenience of description, in FIG. 10, only one transistor T of circuit elements and wires arranged in the circuit element layer PCL will be representatively illustrated. However, a planar/cross-sectional structure of the circuit element layer PCL may be variously changed, and a position and cross-sectional structure of each transistor T may be variously changed according to embodiments.

In addition, the circuit element layer PCL may include a plurality of insulating layers. For example, the circuit element layer PCL may include a buffer layer BFL, a gate insulating layer GI, an interlayer insulating layer ILD, and/or a passivation layer PSV sequentially stacked on one surface of the display substrate SUB. In addition, in some embodiments, the circuit element layer PCL may further include at least one light blocking pattern or the like located under the transistor T.

The buffer layer BFL may reduce or prevent the diffusion of impurities into each circuit element. The buffer layer BFL may be formed as a single layer, but may also be formed a multilayer of at least two layers or more. When the buffer layer BFL is provided as the multilayer, respective layers may be made of the same material or different materials. Various circuit elements such as transistors T and various wires connected to the circuit elements may be located on the buffer layer BFL. Meanwhile, in some embodiments, the buffer layer BFL may be omitted, and in this case, at least one circuit element and/or wire may be directly located on one surface of the display substrate SUB.

Each transistor T may include a semiconductor layer SCL (also referred to as a "semiconductor pattern" or "active layer"), a gate electrode GE, a source electrode SE, and a drain electrode DE. Meanwhile, FIG. 10 illustrates an example in which each transistor T includes the source electrode SE and the drain electrode DE formed separately from the semiconductor layer SCL, but the present disclosure is not limited thereto. For example, in other embodiments, the source electrode SE and the drain electrode DE provided in at least one transistor T may be integrated with each semiconductor layer SCL.

The semiconductor layer SCL may be located on the buffer layer BFL. For example, the semiconductor layer SCL may be located between the display substrate SUB on which the buffer layer BFL is formed and the gate insulating layer GI. The semiconductor layer SCL may include a source region connected to each source electrode SE, a drain region connected to each drain electrode DE, and a channel region located between the source region and the drain region.

According to some embodiments, the semiconductor layer SCL may be a semiconductor pattern made of polysilicon, amorphous silicon, an oxide semiconductor, or the like. In addition, the channel region of the semiconductor layer SCL may be an intrinsic semiconductor as a semiconductor pattern that is not doped with impurities, and each of the source region and the drain region of the semiconductor layer SCL may be a semiconductor pattern doped with impurities (e.g., predetermined impurities).

The semiconductor layer SCL of the transistors T forming each pixel circuit may be made of substantially the same or similar material. For example, the semiconductor layer SCL of the transistors T may be made of one material of polysilicon, amorphous silicon, and an oxide semiconductor. In other embodiments, one or more of the transistors T may include a semiconductor layer SCL made of different materials. For example, some parts of the semiconductor layers SCL of the transistors T may be made of polysilicon or amorphous silicon, while other parts of the semiconductor layer SCL of the transistors T may be made of an oxide semiconductor.

The gate insulating layer GI may be located on the semiconductor layer SCL. For example, the gate insulating layer GI may be located between the semiconductor layer SCL and the gate electrode GE. The gate insulating layer GI may be formed as a single layer or multilayer, and may include at least one inorganic insulating material and/or organic insulating material.

The gate electrode GE may be located on the gate insulating layer GI. For example, the gate electrode GE may be located to overlap the semiconductor insulating layer SCL with the gate insulating layer GI interposed therebetween. Meanwhile, in FIG. 10, a top-gate structure transistor T is illustrated, but in other embodiments, the transistor T may have a bottom-gate structure. In this case, the gate electrode GE may be located under the semiconductor layer SCL to overlap the semiconductor layer SCL.

The interlayer insulating layer ILD may be located on the gate electrode GE. For example, the interlayer insulating layer ILD may be located between the gate electrode GE and the source and drain electrodes SE, DE. The interlayer insulating layer ILD may be formed as a single layer or multilayer, and may include at least one inorganic insulating material and/or organic insulating material.

The source electrode SE and the drain electrode DE may each be located on the semiconductor layer SCL with at least one interlayer insulating layer ILD interposed therebetween. For example, the source electrode SE and the drain electrode DE may be located on different end portions of the semiconductor layer SCL with the gate insulating layer GI and the interlayer insulating layer ILD interposed therebetween.

The source electrode SE and the drain electrode DE may be electrically connected to each semiconductor layer SCL. For example, the source electrode SE and the drain electrode DE may be connected to the source region and the drain region of the semiconductor layer SCL through respective contact holes passing through the gate insulating layer GI and the interlayer insulating layer ILD.

The passivation layer PSV may be located on circuit elements including transistors T and/or wires. The passivation layer PSV may be formed as a single layer or multilayer, and may include at least one inorganic insulating material and/or organic insulating material. For example, the passivation layer PSV includes at least one organic insulating layer, and may substantially flatten a surface of the circuit element layer PCL. The display element layer DPL may be located on the passivation layer PSV. For example, the display element layer DPL may be located on the circuit element layer PCL.

The display element layer DPL may include the first and second electrodes ETL1 and ELT2 described above, and a plurality of connected light emitting elements LD that are located between the first and second electrodes ETL1 and ELT2 and electrically connected to the first and second electrodes ETL1 and ELT2.

The first and second electrodes ETL1 and ELT2 may be located on the passivation layer PSV. The first and second electrodes ETL1 and ELT2 may be directly located on one surface of the passivation layer PSV. A separate partition wall structure or the like may be omitted between the first and second electrodes ETL1 and ELT2 and the passivation layer PSV. That is, the first and second electrodes ETL1 and ELT2 may be formed flat on the passivation layer PSV. In this case, processability may be improved in a process of forming an insulating layer INS (to be described later) on the first and second electrodes ETL1 and ELT2. That is, because the insulating layer INS and the like may be easily formed on the first and second electrodes ETL1 and ELT2 and cracks of the insulating layer INS may be reduced or prevented, device reliability may be secured.

The first and second electrodes ETL1 and ELT2 may include at least one conductive material. For example, the first and second electrodes ETL1 and ELT2 may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), a zinc oxide (ZnO), an antimony zinc oxide (AZO), an indium tin zinc oxide (ITZO), or a tin oxide (SnO2); and at least one conductive material among conductive polymers such as PEDOT, but are not limited thereto. In addition, the first and second electrodes ETL1 and ELT2 may be formed of a single layer or multilayer. For example, the first and second electrodes ETL1 and ELT2 may include at least one reflective electrode layer. In addition, the first and second electrodes ETL1 and ELT2 may selectively include at least one transparent electrode layer located at an upper portion and/or a lower portion of the reflective electrode layer, and/or at least one conductive capping layer covering an upper portion of the reflective electrode layer and/or the transparent electrode layer.

The light emitting elements LD and a plurality of insulating layers INS may be located on the first and second electrodes ETL1 and ELT2. This will be described in detail with reference to FIG. 11.

Referring to FIG. 11, a first insulating layer INS1 may be located on one region of the first and second electrodes ETL1 and ELT2. For example, the first insulating layer INS1 may be formed to cover one region of the first and second electrodes ETL1 and ELT2, and may include an opening exposing one or more other regions of the first and second electrodes ETL1 and ELT2. In some embodiments, the first insulating layer INS1 may be omitted.

The first insulating layer INS1 may be formed to primarily cover the first and second electrodes ETL1 and ELT2. After the light emitting elements LD are provided and arranged on the first insulating layer INS1, the first insulating layer INS1 may be partially opened to expose the first and second electrodes ETL1 and ELT2. Alternatively, in other embodiments, after the light emitting elements LD are completely provided and arranged, the first insulating layer INS1 may be patterned to have individual patterns that are locally located only at a lower portion of the light emitting elements LD. That is, the first insulating layer INS1 between the first and second electrodes ETL1 and ELT2 and the light emitting elements LD and may expose at least one region of each of the electrodes ETL1, ETL2. The first insulating layer INS1 is formed to cover the electrodes after the electrodes are formed, thereby reducing or preventing damage to the electrodes in a subsequent process. In addition, the first insulating layer INS1 may stably support each light emitting element LD.

The first insulating layer INS1 may be formed as a single layer or multilayer, and may include at least one inorganic insulating material and/or organic insulating material.

A plurality of light emitting elements LD may be provided and arranged in each pixel area in which the first insulating layer INS1 is formed, for example, in a light emitting area of each of the sub-pixels SPX1, SPX2, and SPX3. For example, a plurality of light emitting elements LD may be provided in the light emitting area of each of the sub-pixels SPX1, SPX2, and SPX3 through an inkjet method, a slit coating method, or various other methods, and the light emitting elements LD may be aligned with directionality by an alignment signal or alignment voltage.

An insulating pattern INP may be located on one region of the light emitting elements LD. For example, the insulating pattern INP may be partially located only on one region including a central region of each of the light emitting elements LD, while exposing opposite ends of each of the light emitting elements LD. The insulating pattern INP may be formed as an independent pattern on the emitting area of each of the sub-pixels SPX1, SPX2, and SPX3, but is not limited thereto. The insulating pattern INP may be omitted in some embodiments.

The insulating pattern INP may be formed as a single layer or multilayer, and may include at least one inorganic insulating material and/or organic insulating material.

When the insulating pattern INP is formed on the light emitting elements LD after the alignment of the light emitting elements LD is completed, it is possible to reduce or prevent deviation of the light emitting elements LD from an aligned position. In addition, when there is a separation space between the first insulating layer INS1 and the light emitting elements LD, the separation space may be filled with an insulating material introduced in a process of forming the insulating pattern INP. Accordingly, the light emitting elements LD may be more stably supported.

Ends of the light emitting elements LD not covered by the insulating pattern INP may be covered by contact electrodes CE1 and CE2, respectively. For example, respective ends of adjacent contact electrodes CE1 and CE2 may be spaced apart from the respective ends of at least one adjacent light emitting element LD with an insulating pattern INP interposed therebetween.

The contact electrodes CE1 and CE2 may be concurrently or substantially simultaneously formed (e.g., during a same process) on the same layer on one surface of the display substrate SUB as shown in FIG. 11. Accordingly, a manufacturing process of the pixels PXL and the display device 1 including the same may be simplified.

In other embodiments, the contact electrodes CE1 and CE2 may be divided into a plurality of groups and sequentially formed on different layers on one surface of the display substrate SUB for each group. For example, as shown in FIG. 12, a pair of adjacent contact electrodes CE1 and CE2 may be sequentially formed on different layers on one surface of the display substrate SUB. In this case, a third insulating layer INS3 may be additionally located between the pair of contact electrodes CE1 and CE2. That is, a position and mutual arrangement relationship of the contact electrodes CE1 and CE2 may be variously changed.

In addition, the contact electrodes CE1 and CE2 may be respectively located on the first and second electrodes ETL1 and ELT2 to cover exposed areas of the first and second electrodes ETL1 and ELT2. For example, the contact electrodes CE1 and CE2 may be located on at least one region of the first and second electrodes ETL1 and ELT2 so as to contact the first and second electrodes ETL1 and ELT2. Accordingly, the contact electrodes CE1 and CE2 are electrically connected to the first and second electrodes ETL1 and ELT2 located thereon, respectively, and the first and second electrodes ETL1 and ELT2 may be electrically connected to respective ends of the light emitting element LD through the contact electrodes CE1 and CE2.

According to some embodiments, the contact electrodes CE1 and CE2 may be made of various transparent conductive materials. For example, the contact electrodes CE1 and CE2 include at least one of various transparent conductive materials in addition to ITO, IZO, and ITZO, and may be implemented to be substantially transparent or transflective to satisfy a given light transmittance. Accordingly, light emitted from ends of the light emitting elements LD may transmit through the contact electrodes CE1 and CE2 to be emitted to the outside of the display device 1.

A second insulating layer INS2 may be located on the contact electrodes CE1 and CE2. For example, the second insulating layer INS2 may be entirely formed and/or located on the display substrate SUB on which the first and second electrodes ETL1 and ELT2, the light emitting elements LD, the insulating pattern INP, and the contact electrodes CE1 and CE2 are formed, so as to cover the first and second electrodes ETL1 and ELT2, the light emitting elements LD, the insulating pattern INP, and the contact electrodes CE1 and CE2. The second insulating layer INS2 may include at least one inorganic layer and/or organic layer.

The second insulating layer INS2 may include a thin film encapsulation layer having a multi-layered structure, but is not limited thereto. In some embodiments, the second insulating layer INS2 may be formed as a single layer or multilayer, and may include at least one inorganic insulating material and/or organic insulating material. For example, the second insulating layer INS2 may include various types of organic/inorganic insulating materials currently known in addition to a silicon nitride ($SiN_x$) or silicon oxide ($SiO_x$).

Referring back to FIG. 10, a plurality of banks BNK and protective patterns PP may be located on the insulating layer INS. The bank BNK and the protective pattern PP may be directly located on the insulating layer INS. For example, the bank BNK and the protective pattern PP may be directly located on the above-described second insulating layer INS2 to contact the second insulating layer INS2.

The plurality of banks BNK may be located on the insulating layer INS at boundaries of respective sub-pixels SPX1, SPX2, and SPX3. For example, the banks BNK may located at the boundaries of the first to third sub-pixels SPX1, SPX2, and SPX3 described above to define the light emitting areas of the first to third sub-pixels SPX1, SPX2, and SPX3.

The plurality of banks BNK may include an organic insulating material such as a polyacrylates resin, an epoxy resin, a phenolicresin, a polyamides resin, a polyimides rein, an unsaturated polyesters resin, a polyphenylenethers resin, a polyphenylenesulfides resin, or a benzocyclobutene (BCB). However, the present disclosure is not limited thereto, and the bank BNK may include an inorganic insulating material such as a silicon oxide, a silicon nitride, a silicon oxynitride, a hafnium oxide, an aluminum oxide, a titanium oxide, a tantalum oxide, and a zinc oxide, and may be made of an organic-inorganic composite layer.

A reflective layer RL may be further located on one surface of the plurality of banks BNK. The reflective layer RL may directly cover one surface of the plurality of banks BNK. The reflective layer RL may serve to reflect light emitted from ends of the light emitting elements LD to emit the light in a front direction, or forward direction, of the display device 1 (e.g., in a third direction (Z-axis direction)). A constituent material of the reflective layer RL is not particularly limited, and the reflective layer RL may be made of various reflective materials currently known.

The plurality of protective patterns PP may be located in a space surrounded by the banks BNK. The plurality of protective patterns PP may be located on the insulating layer INS to overlap the light emitting elements LD in the third direction (Z-axis direction). The protective pattern PP may be located to cover upper and/or side surfaces of the light emitting device LD. Because the protective pattern PP covers the light emitting element LD, deterioration of color control layers CR, CG, and CB adjacent to the light emitting element LD may be reduced or minimized. The color control layers CR, CG, and CB will be described in detail later.

The protective pattern PP may be made of the same material as the above-described bank BNK. That is, the protective pattern PP may include an organic insulating material such as a polyacrylates resin, an epoxy resin, a phenolicresin, a polyamides resin, a polyimides rein, an unsaturated polyesters resin, a polyphenylenethers resin, a polyphenylenesulfides resin, or a benzocyclobutene (BCB). However, the present disclosure is not limited thereto, and the protective pattern PP may include an inorganic insulating material such as a silicon oxide, a silicon nitride, a silicon oxynitride, a hafnium oxide, an aluminum oxide, a titanium oxide, a tantalum oxide, and a zinc oxide, and may be made of an organic-inorganic composite layer. The protective pattern PP may be concurrently or substantially simultaneously formed by the same process as the bank BNK. Accordingly, the number of masks may be reduced to reduce costs and simplify a manufacturing process.

A thickness H1 of the protective pattern PP may be different from a thickness H2 of the bank BNK. Here, the thickness H1 of the protective pattern PP may mean a length of the third direction (Z-axis direction) from a bottom surface to a top surface of the protective pattern PP, and the thickness H2 of the bank BNK (e.g., a thickness of the bank BNK and the reflective layer RL) may mean a length of the third direction (Z-axis direction) from a bottom surface to a top surface of the bank BNK or to a top surface of the reflective layer RL. For example, the thickness H1 of the protective pattern PP may be smaller than the thickness H2 of the bank BNK. However, the present disclosure is not limited thereto, and the protective pattern PP and the bank BNK may be formed to have substantially the same thickness.

A length W1 in the first direction (X-axis direction) between respective ends of the protective pattern PP may be different from a length W2 IN the first direction (X-axis direction) between one end of the protective pattern PP and one end of the bank BNK (e.g., adjacent ends of the protective pattern PP and the bank BNK). For example, the length W1 of the first direction (X-axis direction) between one end and the other end of the protective pattern PP may be smaller than the length W2 of the first direction (X-axis direction) between one end of the protective pattern PP and one end of the bank BNK. Here, the length W1 in the first direction (X-axis direction) between one end and the other end of the protective pattern PP and the length W2 in the first direction (X-axis direction) between one end of the protective pattern PP and one end of the bank BNK may correspond to a length measured based on a bottom surface of the protective pattern PP and a bottom surface of the bank BNK (e.g., based on ends of the respective bottom surfaces). In this case, a space in which the color control layers CR, CG, and CB are to be provided may be widely secured between one end of the protective pattern PP and one end of the bank BNK. However, the present disclosure is not limited thereto, and the length W1 of the first direction (X-axis direction) between one end and the other end of the protective pattern PP may be substantially the same as the length W2 of the first direction (X-axis direction) between one end of the protective pattern PP and one end of the bank BNK.

The color control layers CR, CG, and CB may be further located on the insulating layer INS. The color control layers CR, CG, and CB may be directly located on the insulating layer INS. For example, the color control layers CR, CG, and CB may be directly located on the above-described second insulating layer INS2 to contact the second insulating layer INS2. The color control layers CR, CG, and CB may be located in a space surrounded by the protective pattern PP and/or the bank BNK. The color control layers CR, CG, and CB may be located respective sides of the light emitting element LD. In this case, light emitted from ends of the light emitting element LD may be directly provided into the color control layers CR, CG, and CB along a horizontal direction (e.g., the first direction (X-axis direction)). That is, because an amount of light lost due to reflection may be reduced or minimized, light efficiency of the display device 1 may be improved. In addition, because a separate color control layer or color control substrate located on the upper portion of the light emitting element LD may be omitted, a thin display device may be implemented.

The color control layers CR, CG, and CB may be located to cover the protective pattern PP. The color control layers CR, CG, and CB may directly cover upper and side surfaces of the protective pattern PP. In this case, a distance from an upper surface of the display substrate SUB to an upper surface of the color control layers CR, CG, and CB (e.g., in a thickness direction) may be greater than a distance from the upper surface of the display substrate SUB to an upper surface of the protective pattern PP. However, the present disclosure is not limited thereto.

Further, the color control layers CR, CG, and CB may be located to cover the bank BNK. When the reflective layer RL is located on one surface of the bank BNK, the color control layers CR, CG, and CB may directly cover one surface of the reflective layer RL. However, the present disclosure is not limited thereto, and the color control layers CR, CG, and CB may be provided with a thickness smaller than that of the bank BNK depending on a manufacturing process.

A refractive index of the color control layers CR, CG, and CB may be different from that of the protective pattern PP. For example, the refractive index of the color control layers CR, CG, and CB may be greater than that of the protective pattern PP.

The color control layers CR, CG, and CB may include a first wavelength converting layer CR located in the first sub-pixel SPX1, a second wavelength converting layer CG located in the second sub-pixel SPX2, and a light transmitting layer CB located in the third sub-pixel SPX3. However, the configuration of the color control layers CR, CG, and CB is not necessarily limited thereto, and may be variously changed according to a wavelength of light emitted by the light emitting element LD of each of the sub-pixels SPX1, SPX2, and SPX3.

The first wavelength converting layer CR may convert or shift a peak wavelength of incident light to light of a given peak wavelength to emit it. For example, the first wavelength converting layer CR may convert light emitted from the first light emitting element LD1 described above into red light having a peak wavelength in a range of about 610 nm to about 650 nm, and then may emit it.

The first wavelength converting layer CR may include a first base resin BS1 and a first wavelength converting material QD1 dispersed in the first base resin BS1, and may further include a first scatterer SC1 dispersed in the first base resin BS1.

The first base resin BS1 may be made of a material having high light transmittance. The first base resin BS1 may be made of an organic material. For example, the first base resin BS1 may include an organic material such as an epoxy-based resin, an acrylic-based resin, a cardo-based resin, or an imide-based resin, but is not limited thereto.

The first wavelength converting material QD1 may convert or shift the peak wavelength of incident light to another given peak wavelength. For example, the first wavelength converting material QD1 may convert light emitted from the first light emitting element LD1 described above into red light having a peak wavelength in a range of about 610 nm to about 650 nm, and then may emit it.

The first wavelength converting material QD1 may include a quantum dot, a quantum rod, a phosphor, or the like. For example, the quantum dot may be a particulate material that emits a given color as electrons transition from a conduction band to a valence band.

The quantum dot may be a semiconductor nano crystalline material. Because the quantum dot has a given bandgap according to a composition and a size thereof, the quantum dot may absorb light and then emit light with a unique wavelength. Semiconductor nanocrystals of the quantum dot may include a Group IV nanocrystal, a Group II-VI compound nanocrystal, a Group III-V compound nanocrystal, a Group IV-VI nanocrystal, a combination thereof, and the like.

The Group II-VI compound may be selected from a two-element compound selected from CdSe, CdTe, ZnS, ZnSe, ZnTe, ZnO, HgS, HgSe, HgTe, MgSe, MgS, and a mixture thereof; a three-element compound selected from InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from a two-element compound selected from GaN, GaP, GaAs, GaSb, AlN, AlP, AlAs, AlSb, InN, InP, InAs, InSb, and a mixture thereof; a three-element compound selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and a mixture thereof; and a four-element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from a two-element compound selected from SnS, SnSe, SnTe, PbS, PbSe, PbTe, and a mixture thereof; a three-element compound selected from SnSeS, SnSeTe, SnSTe, PbSeS, PbSeTe, PbSTe, SnPbS, SnPbSe, SnPbTe, and a mixture thereof; and a four-element compound selected from SnPbSSe, SnPbSeTe, SnPbSTe, and a mixture thereof. The Group IV element may be selected from Si, Ge, and a mixture thereof. The Group IV compound may be a two-element compound selected from SiC, SiGe, and a mixture thereof.

In this case, the two-element compound, the three-element compound, or the four-element compound may be present in particles at substantially uniform concentrations, or they may be divided into states having partially different concentrations to be present in the same particle, respectively. In addition, a core/shell structure in which some quantum dots enclose some other quantum dots may be possible. An interface between the core and the shell may have a concentration gradient in which a concentration of elements of the shell decreases closer to its center.

In some embodiments, the quantum dot may have a core-shell structure that includes a core including the nanocrystal described above, and a shell surrounding the core. The shell of the quantum dot may serve as a passivation layer for maintaining a semiconductor characteristic and/or as a charging layer for applying an electrophoretic characteristic to the quantum dot by reducing or preventing chemical denaturation of the core. The shell may be a single layer or a multilayer. An interface between the core and the shell may have a concentration gradient in which a concentration of elements of the shell decreases closer to its center. An example of the shell of the quantum dot includes a metal or nonmetal oxide, a semiconductor compound, or a combination thereof.

For example, the metal or nonmetal oxide may be a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or a three-element compound such as $MgAl_2O_4$, $CoFe_2O_4$, $NiFe_2O_4$, $CoMn_2O_4$, and the like, but the present disclosure is not limited thereto.

In addition, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or the like, but the present disclosure is not limited thereto.

The first scatterer SC1 may have a refractive index that is different from that of the first base resin BS1, and may form an optical interface with the first base resin BS1. For example, the first scatterer SC1 may be a light scattering particle. The first scatterer SC1 is not particularly limited as long as it is a material capable of scattering at least a portion of transmissive light, and may be, for example, a metal oxide particle or organic particle. The metal oxide may include a titanium oxide (TiO2), a zirconium oxide (ZrO2), an aluminum oxide (Al2O3), an indium oxide (In2O3), a zinc oxide (ZnO), or a tin oxide (SnO2), and a material of the organic particle may be an acrylic-based resin, a urethane-based resin, or the like. The first scatterer SC1 may scatter light in a random direction regardless of an incident direction of the incident light without substantially converting a wavelength of light transmitting through the first wavelength converting layer CR.

The second wavelength converting layer CG may convert or shift the peak wavelength of the incident light to light of another given peak wavelength to emit it. For example, the second wavelength converting layer CG may convert light emitted from the first light emitting element LD2 described above into green light having a peak wavelength in a range of about 510 nm to about 550 nm, and then may emit it.

The second wavelength converting layer CG may include a second base resin BS2 and a second wavelength converting material QD2 dispersed in the second base resin BS2, and may further include a second scatterer SC2 dispersed in the second base resin BS2.

The second base resin BS2 may be made of a material having high light transmittance. The second base resin BS2 may be made of an organic material. For example, the second base resin BS2 may be made of the same material as the first base resin BS1, or may include at least one of materials included in the constituent materials of the first base resin BS1, but is not limited thereto.

The second wavelength converting material QD2 may convert or shift the peak wavelength of the incident light to another given peak wavelength. For example, the second wavelength converting material QD2 may convert light emitted from the first light emitting element LD2 into green light having a peak wavelength in a range of about 510 nm to about 550 nm.

The first wavelength converting material QD2 may include a quantum dot, a quantum rod, a phosphor, or the like. When both the first wavelength converting material QD1 and the second wavelength converting material QD2 are made of the quantum dot, a particle size of the quantum dot included in the first wavelength converting material QD1 may be larger than that of the quantum dot included in the second wavelength converting material QD2.

The second scatterer SC2 may have a refractive index that is different from that of the second base resin BS2, and may form an optical interface with the second base resin BS2. For example, the second scatterer SC2 may be a light scattering particle. Other detailed descriptions of the second scatterer SC2 are substantially the same as, or similar to, those of the first scatterer SC1, and thus are omitted.

The light transmitting layer CB may include a third base resin BS3, and may further include a third scatterer SC3 dispersed in the third base resin BS3.

The third base resin BS3 may be made of a material having high light transmittance. The third base resin BS3 may be made of an organic material. For example, the third base resin BS3 may be made of the same material as the first base resin BS1, or may include at least one of materials included in the constituent materials of the first base resin BS1, but is not limited thereto.

The third scatterer SC3 may have a refractive index that is different from that of the third base resin BS3, and may form an optical interface with the third base resin BS3. For example, the third scatterer SC3 may be a light scattering particle. Other detailed descriptions of the third scatterer SC3 are substantially the same as, or similar to, those of the first scatterer SC1, and thus are omitted.

A light blocking member BM may be located on the color control layers CR, CG, and CB. The light blocking member BM may be located at the boundaries of the first to third sub-pixels SPX1, SPX2, and SPX3 described above. In addition the light blocking member BM may be located to overlap the above-described bank BNK in the third direction (Z-axis direction). The light blocking member BM may include an organic light blocking material, and may be formed through a coating and exposure process of the organic light blocking material. The light blocking member BM absorbs external light, thereby reducing color distortion due to external light reflection. In addition, the light blocking member BM may reduce or prevent intrusion of light between adjacent sub-pixels SPX1, SPX2, and SPX3 so that a mixed color does not occur, thereby improving color reproduction.

A capping layer CPL may be located on the color control layers CR, CG, and CB and the light blocking member BM. The capping layer CPL may be located on an entire surface of the display substrate SUB. The capping layer CPL may be an inorganic insulating layer made of an inorganic material. The capping layer CPL may entirely cover the color control layers CR, CG, and CB to serve as an encapsulation layer to reduce or prevent penetration of oxygen and/or moisture into the color control layers CR, CG, and CB from the outside.

Color filters FR, FG, and FB may be located on the capping layer CPL. The color filters FR, FG, and FB may be directly located on the capping layer CPL to contact one surface of the capping layer CPL. The color filters FR, FG, and FB may include first to third color filters FR, FG, and FB located in the first to third sub-pixels SPX1, SPX2, and SPX3, respectively. Each of the first to third color filters FR, FG, and FB may selectively transmit light of a given color while absorbing light of other colors to block them.

For example, the first color filter FR may selectively transmit red light, and may block or absorb green light and blue light. The first color filter FR may be a red color filter, and may include a red colorant such as a red dye or a red pigment. In the present specification, a colorant may be understood to be a concept including both a dye and a pigment.

In addition, the second color filter FG may selectively transmit green light, and may block or absorb red light and blue light. The second color filter FG may be a green color filter, and may include a green colorant such as a green dye or a green pigment.

In addition, the third color filter FB may selectively transmit blue light, and may block or absorb red light and green light. The third color filter FB may be a blue color filter, and may include a blue colorant such as a blue dye or a blue pigment.

A protective layer PSL may be further located on the color filters FR, FG, and FB. The protective layer PSL may be an inorganic insulating layer made of an inorganic material. The protective layer PSL may be located on an entire surface of the display substrate SUB. The protective layer PSL may entirely cover the pixels PXL to reduce or prevent damage to the pixels PXL due to external foreign matters.

According to the above-described embodiments, because the first and second electrodes ETL1 and ELT2 are flat on the passivation layer PSV, while the insulating layer INS is formed on the first and second electrodes ETL1 and ELT2, processability may be improved, and device reliability may be secured. In addition, as the color control layers CR, CG, and CB are located on sides of the light emitting element LD, light emitted from ends of the light emitting element LD may be directly provided into the color control layers CR, CG, and CB along a horizontal direction (e.g., the first direction (X-axis direction)). That is, because an amount of light lost due to reflection may be reduced or minimized, light efficiency of the display device 1 may be improved. In addition, because a separate color control layer or color control substrate located on the upper portion of the light emitting element LD may be omitted, a thin display device may be implemented.

Hereinafter, a display device according to some embodiments of the present disclosure will be described. The same elements as those described above will be referred to the same reference numerals in embodiments below, and redundant descriptions will be omitted or simplified.

Figure 13:
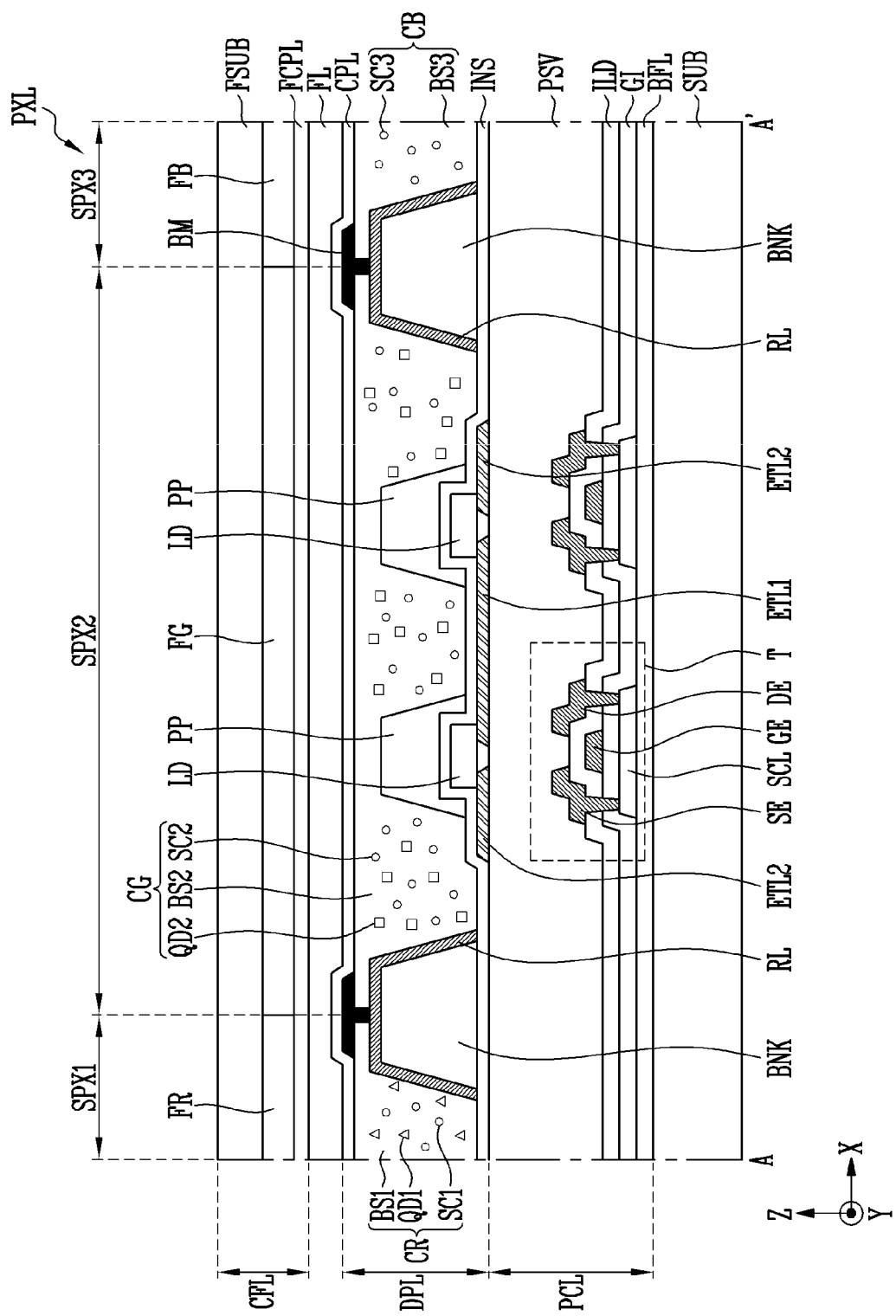
FIG. 13 illustrates a cross-sectional view of a display device according to other embodiments.

FIG. 13 illustrates a cross-sectional view of a display device according to other embodiments.

Referring to FIG. 13, a display device according to the present example is different from the embodiments of FIG. 1 to FIG. 12 in that it includes a separate color filter layer CFL.

For example, the color filter layer CFL may be located on the display element layer DPL. The color filter layer CFL may include a color filter substrate FSUB, a color filter FR, FG, and FB, and a color capping layer FCPL.

The color filter substrate FSUB may be a rigid substrate or a flexible substrate, and its material or physical properties are not particularly limited. For example, the color filter substrate FSUB may be a rigid substrate made of glass or tempered glass, or a flexible substrate made of a thin film made of plastic or metal. In addition, the color filter substrate FSUB may be a transparent substrate, but is not limited thereto. For example, the color filter substrate FSUB may be a translucent substrate, an opaque substrate, or a reflective substrate.

The color filters FR, FG, and FB may be located on one surface of the color filter substrate FSUB. Because the color filters FR, FG, and FB have been described in detail with reference to FIG. 10, redundant descriptions are omitted.

A color capping layer FCPL may be located on the color filters FR, FG, and FB. The color capping layer FCPL may be located on an entire surface of the color filter substrate FSUB. The color capping layer FCPL may be an inorganic insulating layer made of an inorganic material. The color capping layer FCPL may entirely cover one surface of the color filters FR, FG, and FB.

A filling layer FL may be located between the color filter layer CFL and the display element layer DPL. The filling layer FL may fill a space between the color filter layer CFL and the display element layer DPL. The filling layer FL may be located between the color capping layer FCPL of the color filter layer CFL and the capping layer CPL of the display element layer DPL to directly contact respective surfaces of the color capping layer FCPL and the capping layer CPL. The filling layer FL may be made of a material that may transmit light. The filling layer FL may be made of an organic material. The organic material may include a silicon-based organic material or an epoxy-based organic material, but is not limited thereto. In addition, in other embodiments, the filling layer FL may be omitted.

Figure 14:
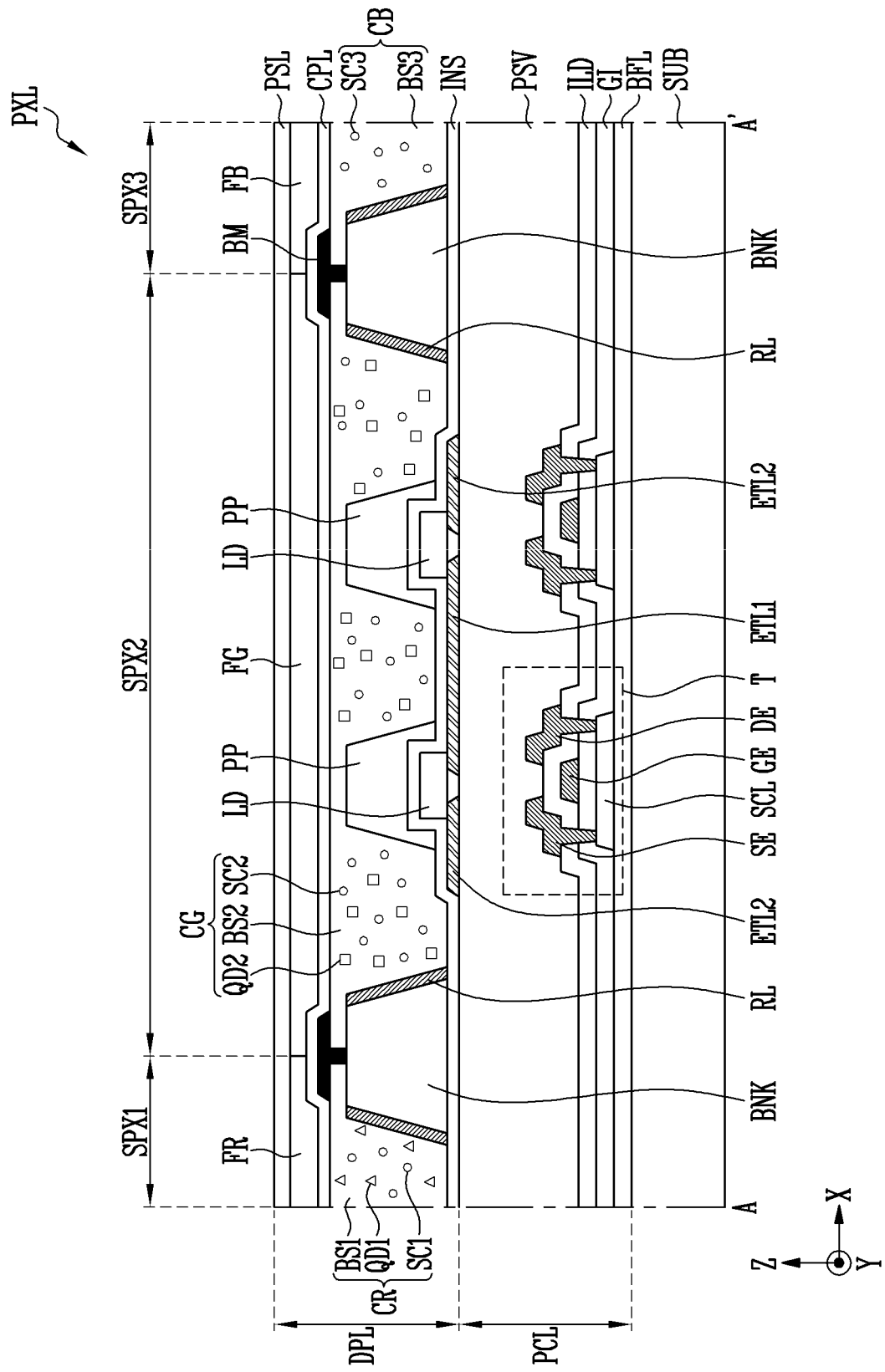
FIG. 14 illustrates a cross-sectional view of a display device according to other embodiments.

FIG. 14 illustrates a cross-sectional view of a display device according to other embodiments.

Referring to FIG. 14, a display device according to the present example is different from the embodiments of FIG. 1 to FIG. 12 in that the reflective layer RL is partially disposed on the banks BNK.

For example, the reflective layer RL may be partially disposed on the side surfaces of the banks BNK. The reflective layer RL may directly cover the side surfaces of the banks BNK. The reflective layer RL may expose the top surfaces of the banks BNK. That is, the reflective layer RL may include openings partially removed from the top of the banks BNK to expose the top surfaces of the banks BNK. The top surfaces of the banks BNK exposed by the openings of the reflective layer RL may contact the color control layers CR, CG, and CB and/or the light blocking member BM, but are not limited thereto. Subsequently, a manufacturing method of the display device according to the above-described embodiments will be described.

FIG. 15 to FIG. 21 illustrate cross-sectional views of process steps of a manufacturing method of a display device according to some embodiments. Hereinafter, the same constituent elements as those of FIG. 1 to FIG. 12 are denoted by the same reference numerals and detailed reference numerals are omitted.

Figure 15:
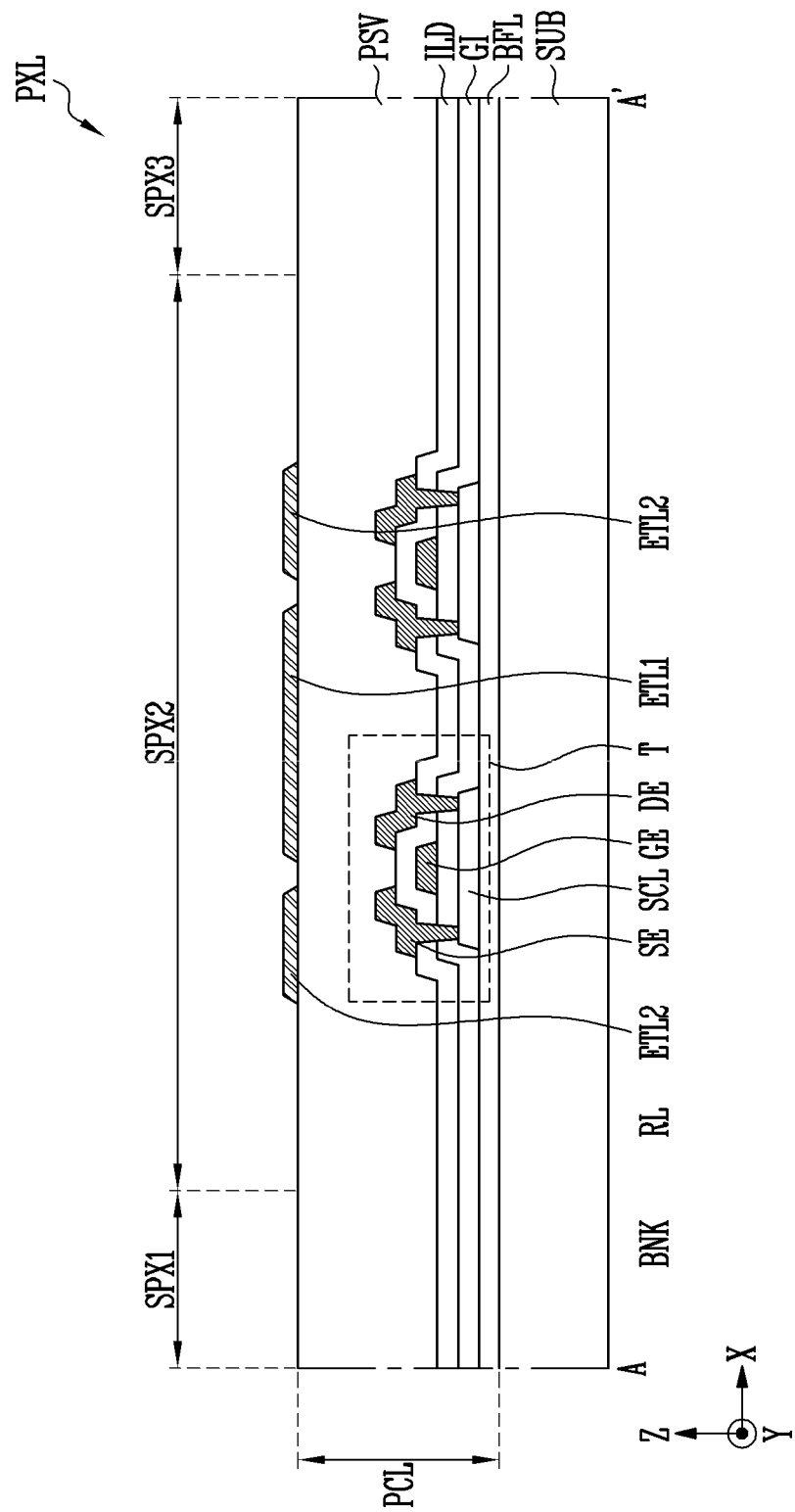
FIG. 15 to FIG. 21 illustrate cross-sectional views of process steps of a manufacturing method of a display device according to some embodiments.

Referring to FIG. 15, first, the display substrate SUB on which the circuit element layer PCL or the like is formed is prepared, and the first and second electrodes ETL1 and ETL2 are formed on the display substrate SUB. A separate partition wall structure and the like are omitted between the first and second electrodes ETL1 and ETL2 and the passivation layer PSV, so that the first and second electrodes ETL1 and ETL2 may be formed flat along the upper surface of the passivation layer PSV. Accordingly, as described above, it is possible to improve processability in a process of forming the insulating layer INS on the first and second electrodes ETL1 and ETL2 in a subsequent process.

Figure 16:
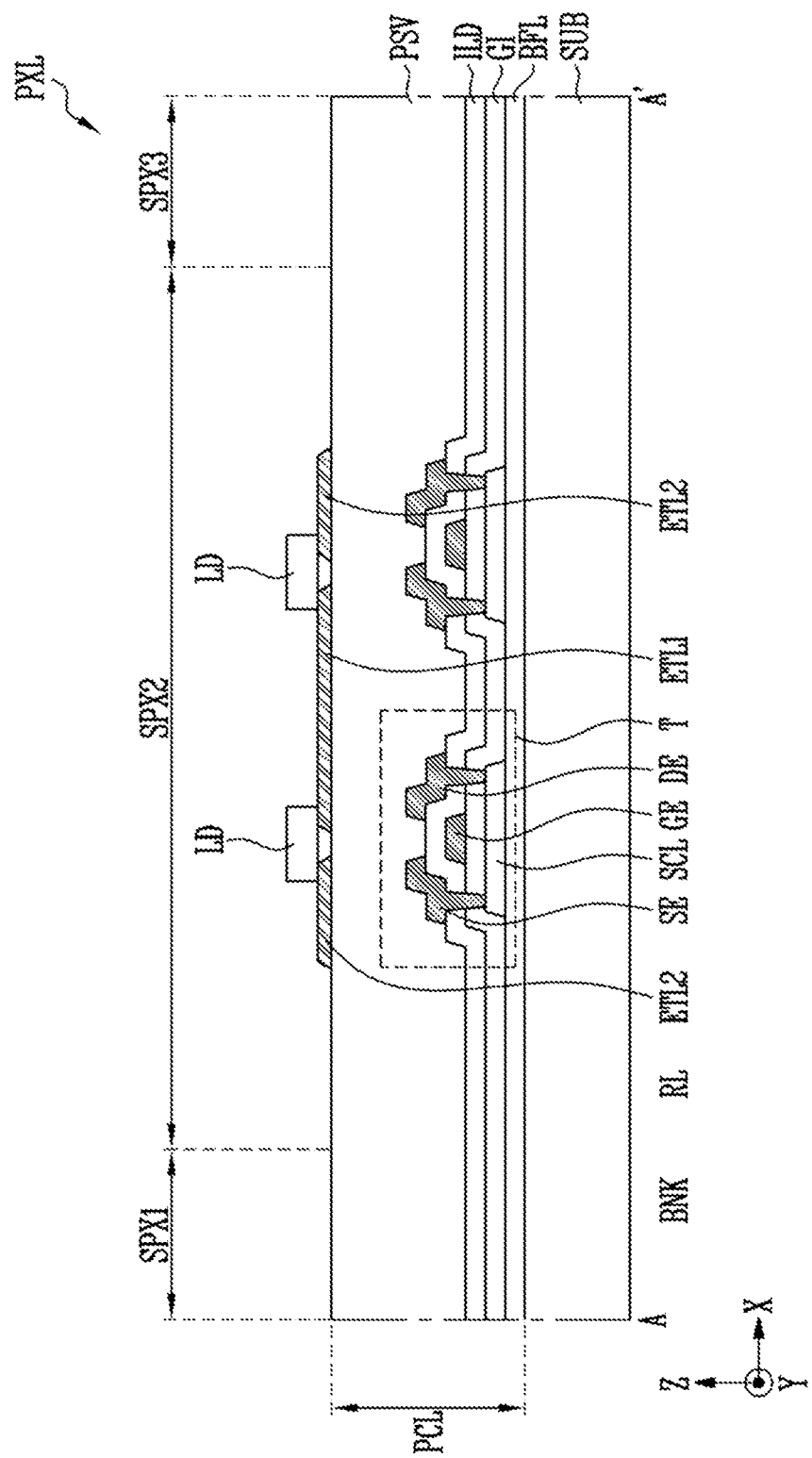

Referring to FIG. 16, subsequently, the light emitting elements LD are provided on the first and second electrodes ETL1 and ETL2. The light emitting elements LD are prepared in a form to be dispersed in a solution (e.g., a predetermined solution), and may be supplied in the light emitting areas of each of the sub-pixels SPX1, SPX2, and SPX3 through an inkjet printing method. For example, the light emitting elements LD may be mixed with a volatile solvent and dropped in each light emitting area. In this case, when a given voltage is supplied through the first and second electrodes ELT1 and ELT2 of each of the sub-pixels SPX1, SPX2, and SPX3, as an electric field is generated between the first and second electrodes ELT1 and ELT2, the light emitting elements LD may be aligned between the first and second electrodes ELT1 and ELT2. After the light emitting elements LD are aligned, the solvent may be volatilized, or removed in other ways, and thus the light emitting elements LD may be stably arranged between the first and second electrodes ELT1 and ELT2.

Figure 17:
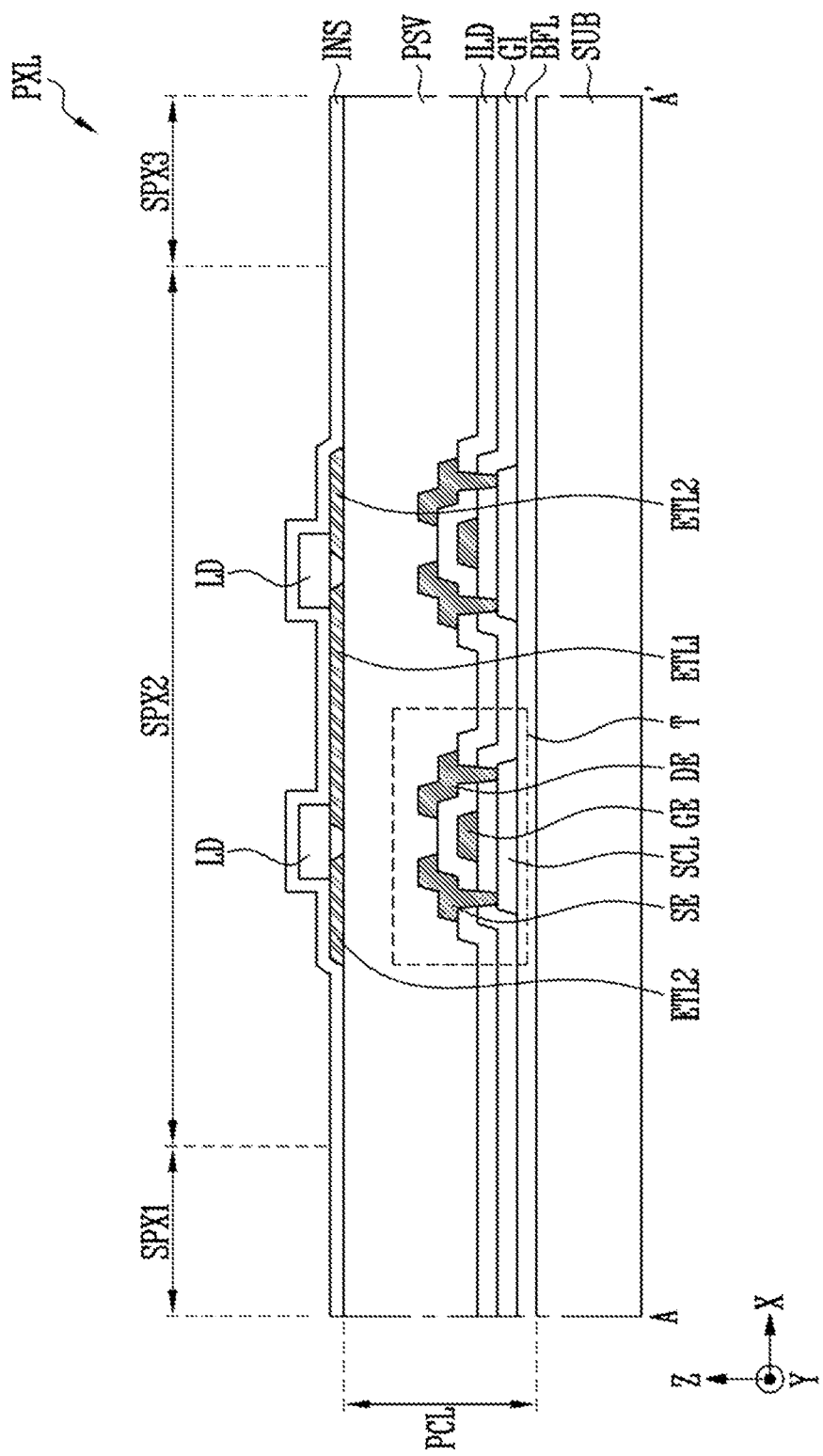

Referring to FIG. 17, subsequently, the insulating layer INS is formed on the light emitting elements LD. The insulating layer INS may be formed as a single layer or multilayer, and may include at least one inorganic insulating material and/or organic insulating material. For example, the insulating layer INS may include various types of organic/inorganic insulating materials currently known in addition to a silicon nitride (SiNx) or silicon oxide (SiOx). As described above, because the insulating layer INS is formed on the first and second electrodes ETL1 and ETL2 that are relatively formed to be flat, processability may be secured to improve device reliability, which is described above.

Figure 18:
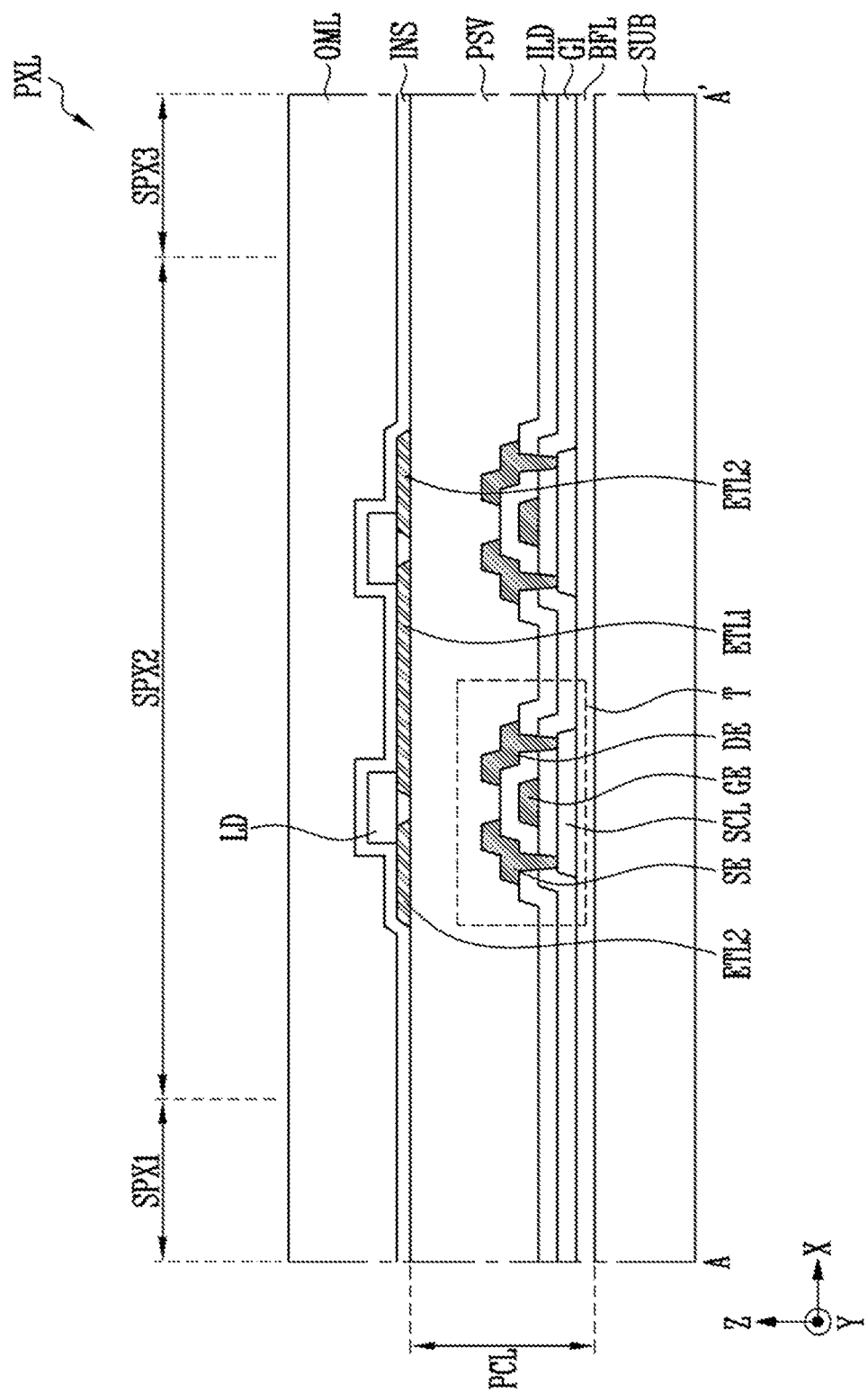

Referring to FIG. 18, subsequently, an organic layer OLM is formed on the insulating layer INS. The organic layer OLM may include an organic insulating material such as a polyacrylates resin, an epoxy resin, a phenolicresin, a polyamides resin, a polyimides rein, an unsaturated polyesters resin, a polyphenylenethers resin, a polyphenylenesulfides resin, or a benzocyclobutene (BCB), but is not necessarily limited thereto.

Figure 19:
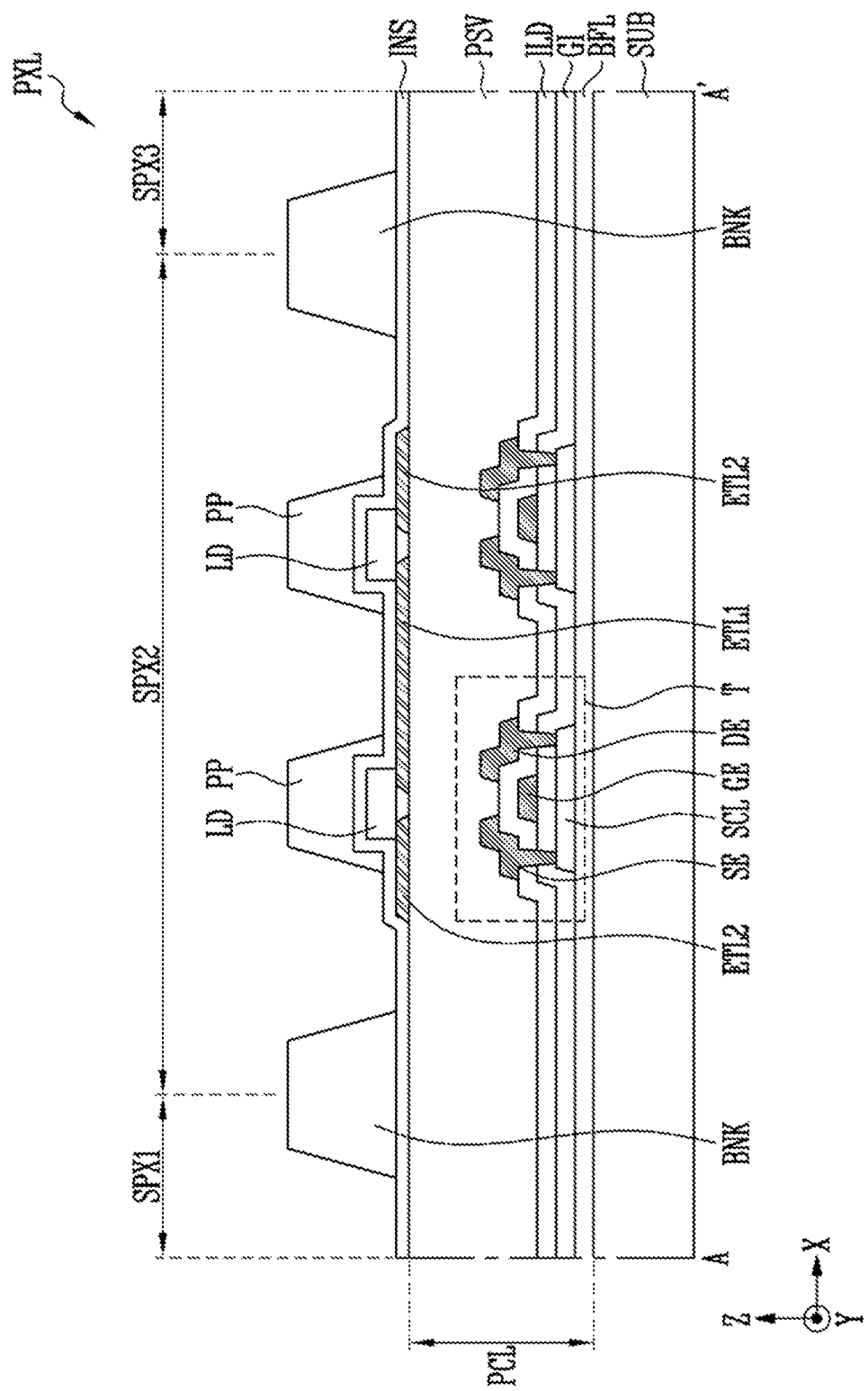

Referring to FIG. 19, subsequently, the organic layer OML is patterned to form the bank BNK, or a portion of the bank, and the protective pattern PP on the insulating layer INS. The bank BNK and the protective pattern PP may be formed by patterning the organic layer OML through an exposure and development process. The bank BNK and the protective pattern PP may be simultaneously formed by the same process. Accordingly, it is as described above that the number of masks may be reduced and the manufacturing process of the display device 1 may be simplified.

Figure 20:
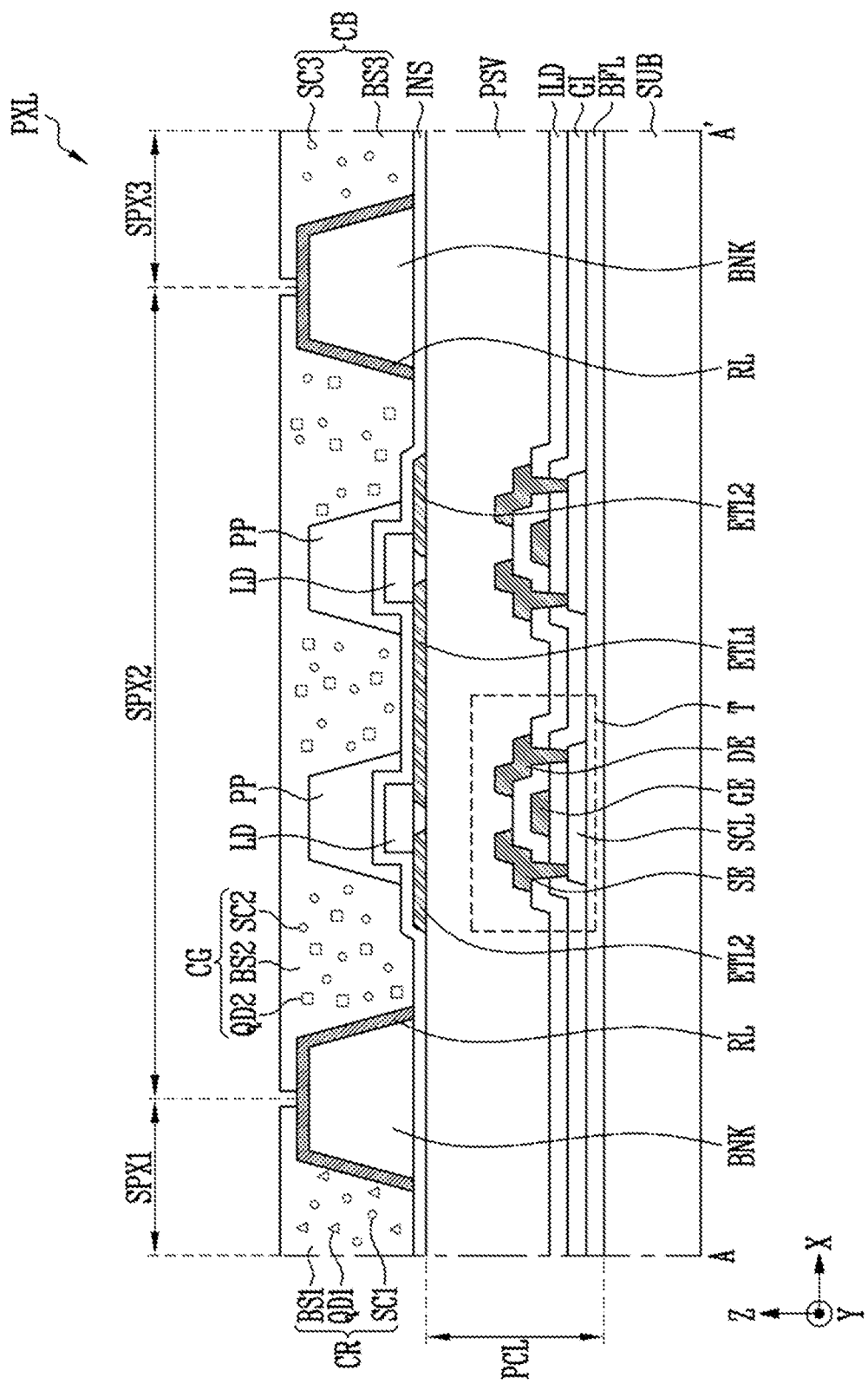

Referring to FIG. 20, subsequently, the color control layers CR, CG, and CB are formed in the space surrounded by the bank BNK and/or the protective pattern PP. The color control layers CR, CG, and CB may be formed by a vapor deposition or inkjet printing method, but are not limited thereto. As described above, the color control layers CR, CG, and CB may be located on sides of the light emitting element LD. In this case, light emitted from ends of the light emitting element LD may be directly provided into the color control layers CR, CG, and CB along a horizontal direction, that is, the first direction (X-axis direction). That is, because an amount of light lost due to reflection may be reduced or minimized, light efficiency of the display device 1 may be improved. In addition, it is as described above that, because a separate color control layer or color control substrate located on the upper portion of the light emitting element LD may be omitted, a thin display device may be implemented.

Figure 21:
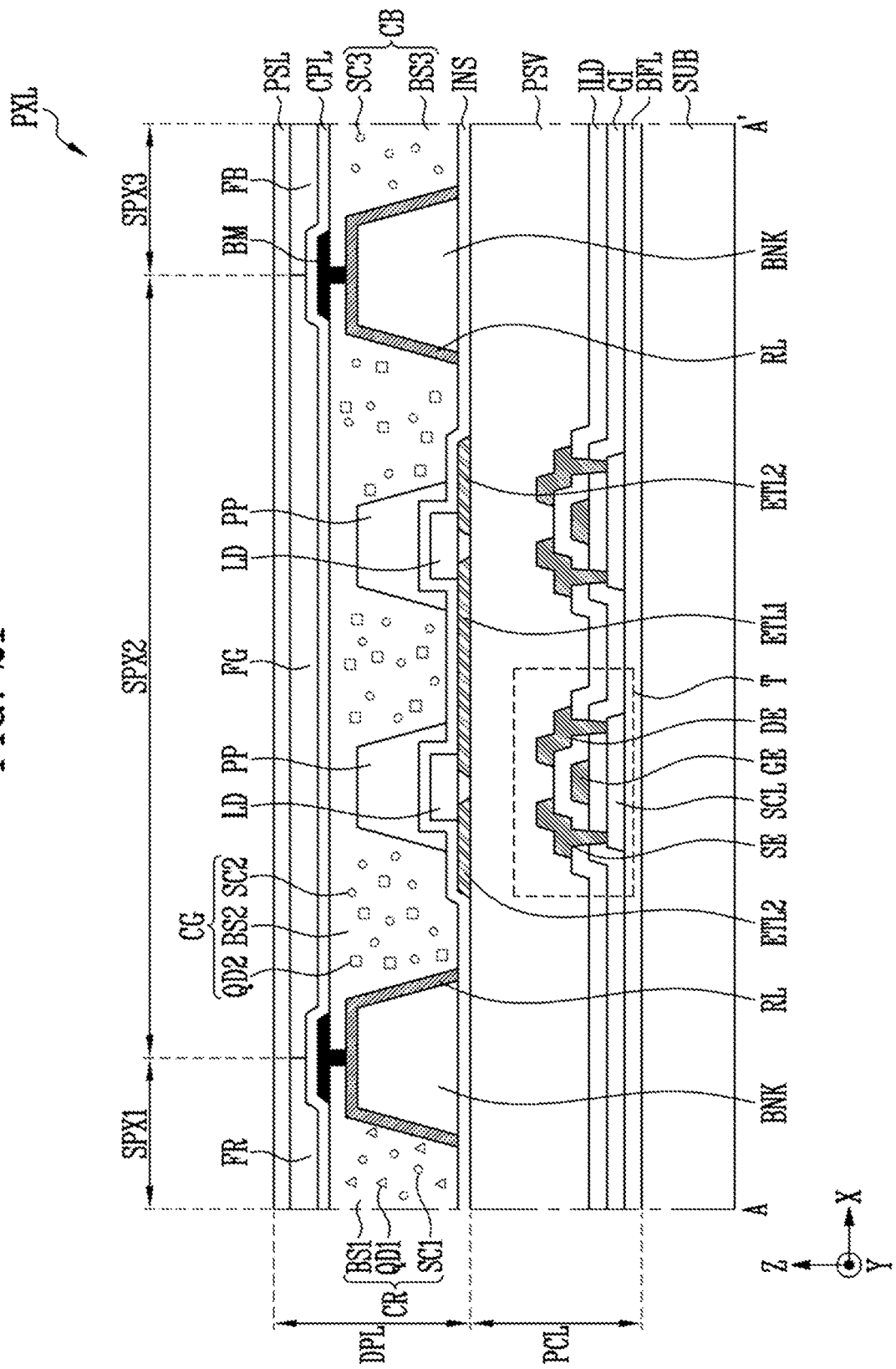

Referring to FIG. 21, subsequently, the light blocking member BM, the capping layer CPL, the color filters FR, FG, and FB, and the protective layer PSL are formed on the color control layers CR, CG, and CB, and thus, the display device 1 shown in FIG. 10 may be completed.

Those skilled in the art related to the described embodiments will readily appreciate that many modifications are possible without materially departing from the novel teachings and advantages. The embodiments should be considered in a descriptive sense only and not for purposes of limitation. The scope of the invention, not by the detailed description given in the appended claims, and all differences within the equivalent scope will be construed as being included in the present disclosure.

What is claimed is:

1. A display device comprising:
    a display substrate;
    sub-pixels on the display substrate, each of the sub-pixels comprising:
        a first electrode and a second electrode on the display substrate and spaced apart from each other;
        light emitting elements between the first electrode and the second electrode;
        an insulating layer covering the light emitting elements;
        a protective pattern on the insulating layer and overlapping an entirety of one of the light emitting elements; and
        a bank on the insulating layer at a boundary of one of the sub-pixels.

2. The display device of claim 1, wherein the protective pattern covers upper and side surfaces of the one of the light emitting elements.

3. The display device of claim 1, wherein the protective pattern and the bank are directly on the insulating layer.

4. The display device of claim 1, wherein the protective pattern and the bank comprise a same material.

5. The display device of claim 4, wherein the protective pattern and the bank comprise an organic insulating material.

6. The display device of claim 1, wherein a distance between respective ends of the protective pattern is less than a distance between one end of the protective pattern and one end of the bank.

7. The display device of claim 6, wherein a thickness of the protective pattern is less than a thickness of the bank.

8. The display device of claim 1, wherein the sub-pixels comprise a first sub-pixel, a second sub-pixel, and a third sub-pixel, and
    wherein the bank is at boundaries of the first sub-pixel, the second sub-pixel, and the third sub-pixel.

9. The display device of claim 8, wherein the light emitting elements comprise:
    first light emitting elements in the first sub-pixel;
    second light emitting elements in the second sub-pixel; and
    third light emitting elements in the third sub-pixel, and
    wherein the first to third light emitting elements emit light of a same color.

10. The display device of claim 8, further comprising:
    a first wavelength converting layer in the first sub-pixel;
    a second wavelength converting layer in the second sub-pixel; and
    a light transmitting layer in the third sub-pixel.

11. The display device of claim 1, further comprising a color control layer on the insulating layer.

12. The display device of claim 11, wherein the color control layer comprises a base resin, and quantum dots dispersed in the base resin.

13. The display device of claim 11, further comprising a reflective layer on a surface of the bank.

14. The display device of claim 11, wherein a refractive index of the protective pattern is smaller than a refractive index of the color control layer.

15. The display device of claim 11, further comprising:
    a color filter substrate on the display substrate;
    a color filter on a surface of the color filter substrate; and
    a filling layer between the color filter and the color control layer.

16. The display device of claim 11, further comprising a capping layer on the color control layer.

17. The display device of claim 16, further comprising a color filter directly on the capping layer.

18. A display device comprising:
    a display substrate;
    sub-pixels on the display substrate, each of the sub-pixels comprising:
        a first electrode and a second electrode on the display substrate and spaced apart from each other;
        light emitting elements between the first electrode and the second electrode;
        an insulating layer covering the light emitting elements;
        a protective pattern on the insulating layer and overlapping one of the light emitting elements; and
        a bank on the insulating layer at a boundary of one of the sub-pixels; and
    a color control layer on the insulating layer, and directly covering the protective pattern.

19. The display device of claim 18, wherein the color control layer covers ends of the one of the light emitting elements.

20. A display device comprising:
    a display substrate;

sub-pixels on the display substrate, each of the sub-pixels comprising:

a first electrode and a second electrode on the display substrate and spaced apart from each other;

light emitting elements between the first electrode and the second electrode;

an insulating layer covering the light emitting elements;

a protective pattern on the insulating layer and overlapping one of the light emitting elements; and a bank on the insulating layer at a boundary of one of the sub-pixels; and a color control layer on the insulating layer, wherein a refractive index of the protective pattern is smaller than a refractive index of the color control layer.

* * * * *